(12) United States Patent
Zheng et al.

(10) Patent No.: US 11,652,497 B2
(45) Date of Patent: May 16, 2023

(54) NEURAL NETWORK-BASED QUANTUM ERROR CORRECTION DECODING METHOD AND APPARATUS, AND CHIP

(71) Applicant: Tencent Technology (Shenzhen) Company Limited, Shenzhen (CN)

(72) Inventors: Yicong Zheng, Shenzhen (CN); Shengyu Zhang, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 30 days.

(21) Appl. No.: 17/460,011

(22) Filed: Aug. 27, 2021

(65) Prior Publication Data

US 2021/0391873 A1  Dec. 16, 2021

Related U.S. Application Data

(63) Continuation of application No. PCT/CN2020/135047, filed on Dec. 9, 2020.

(30) Foreign Application Priority Data

Apr. 15, 2020 (CN) .......................... 202010296660.4

(51) Int. Cl.
*H03M 13/00* (2006.01)
*H03M 13/15* (2006.01)
(Continued)

(52) U.S. Cl.
CPC ..... *H03M 13/1575* (2013.01); *G06F 11/1068* (2013.01); *G06N 10/00* (2019.01); *G06N 10/70* (2022.01)

(58) Field of Classification Search
CPC ... H03M 13/1575; G06N 10/70; G06N 10/00; G06F 11/1068
See application file for complete search history.

(56) References Cited

U.S. PATENT DOCUMENTS 9,748,976 B2 * 8/2017 Naaman ............ H03M 13/1525
9,762,262 B2 * 9/2017 Ashikhmin ....... H03M 13/1575
(Continued)

FOREIGN PATENT DOCUMENTS

CN    102118226 A    7/2011
CN    109257166 A    1/2019
(Continued)

OTHER PUBLICATIONS

Tencent Technology, WO, PCT/CN2020/135047, Mar. 8, 2021, 5 pgs.

(Continued)

*Primary Examiner* — Esaw T Abraham
(74) *Attorney, Agent, or Firm* — Morgan, Lewis & Bockius LLP

(57) ABSTRACT

This application discloses a neural network-based QEC decoding method. The method includes: obtaining error syndrome information of a quantum circuit; performing block feature extraction on the error syndrome information by using a neural network decoder, to obtain feature information; and performing fusion decoding processing on the feature information by using the neural network decoder, to obtain error result information, the error result information being used for determining a data qubit in which an error occurs in the quantum circuit and a corresponding error type. In this application, a block feature extraction manner is used, a quantity of channels of feature information obtained by each feature extraction is reduced, and inputted data of next feature extraction is reduced, which reduces a quantity of feature extraction layers in a neural network decoder. Therefore, a decoding time used by the neural network decoder is reduced, thereby achieving real-time error correction.

20 Claims, 19 Drawing Sheets

(51) Int. Cl.
  *G06N 10/00* (2022.01)
  *G06F 11/10* (2006.01)
  *G06N 10/70* (2022.01)

(56) References Cited

U.S. PATENT DOCUMENTS

| | | | | |
|---|---|---|---|---|
| 11,025,907 | B2* | 6/2021 | Li | G06N 3/08 |
| 11,374,594 | B2* | 6/2022 | Hogaboam | G06N 3/049 |
| 11,444,636 | B2* | 9/2022 | Lucarelli | H03M 13/2906 |
| 11,469,778 | B2* | 10/2022 | Delfosse | H03M 13/1575 |
| 2003/0204794 | A1 | 10/2003 | Barrett et al. | |
| 2015/0214978 | A1 | 7/2015 | Yoon et al. | |
| 2019/0044542 | A1 | 2/2019 | Hogaboam et al. | |

FOREIGN PATENT DOCUMENTS

| | | |
|---|---|---|
| CN | 110011671 A | 7/2019 |
| CN | 110380824 A | 10/2019 |
| CN | 110518920 A | 11/2019 |
| CN | 111510157 A | 8/2020 |
| CN | 111510158 A | 8/2020 |
| DE | 2018121905 A1 | 3/2019 |
| EP | 3934104 A1 | 1/2022 |
| WO | WO 2019212878 A1 | 11/2019 |

OTHER PUBLICATIONS

Tencent Technology, IPRP, PCT/CN2020/135047, Oct. 13, 2022, 6 pgs.
Christopher Chamberland et al., "Deep Neural Decoders for Near Term Fault-Tolerant Experiments", Arxiv.Org, Library Cornell University, NY, Feb. 18, 2018, XP081227798, 26 pgs.
Extended European Search Report, EP2077093 0.4, dated Apr. 11, 2022, 11 pgs.
Milap Sheth et al., "Neural Ensemble Decoding for Topological Quantum Error-Correcting Codes", Arxiv.Org, Library Cornell University, NY, May 7, 2019, XP081273082, 9 pgs.
Savvas Varsamopoulos et al., "Comparing Neural Network Based Decoders for the Surface Code", Quantum and Computer Engineering, Arxiv.Org, Library Cornell University, NY, Nov. 29, 2018, XP081556395, 18 pgs.
Tencent Technology, ISR, PCT/CN2020/135047, Mar. 8, 2021, 2 pgs.
Marcin Niemiec et al., "Security Verification of Artificial Neural Networks Used to Error Correction in Quantum Cryptography" 2018 26th Telecommunications Forum (TELFOR), Nov. 21, 2018, 3 pgs., Retrieved from the Internet: https://ieeexplore.ieee.org/abstract/document/8612006.

* cited by examiner

NEURAL NETWORK-BASED QUANTUM ERROR CORRECTION DECODING METHOD AND APPARATUS, AND CHIP

CROSS-REFERENCE TO RELATED APPLICATIONS

This application is a continuation application of PCT Patent Application No. PCT/CN2020/135047, entitled "NEURAL NETWORK-BASED QUANTUM ERROR CORRECTION DECODING METHOD AND APPARATUS, AND CHIP" filed on Dec. 9, 2020, which claims priority to Chinese Patent Application No. 202010296660.4, filed with the State Intellectual Property Office of the People's Republic of China on Apr. 15, 2020, and entitled "NEURAL NETWORK-BASED QUANTUM ERROR CORRECTION DECODING METHOD AND APPARATUS, AND CHIP", all of which are incorporated herein by reference in their entirety.

FIELD OF THE TECHNOLOGY

Embodiments of this application relate to the field of artificial intelligence and quantum technologies, and in particular, to a neural network-based quantum error correction decoding method and apparatus, and a chip.

BACKGROUND OF THE DISCLOSURE

Since qubits are extremely susceptible to noise, it is still not practical to directly implement quantum computation (QC) by physical qubits with current technologies. With the development of the quantum error correction (QEC) code technology and fault tolerant quantum computation (FTQC) technology, it becomes possible in principle to implement QC of arbitrary precisions by qubits with noise.

If only quantum information is stored, all error syndromes may be detected and collected, and finally error correction is performed according to all syndrome information. This error correction manner is referred to as post-processing. However, when FTQC is performed, a quantum circuit changes an error type in real time, and errors occurring in different time and space cannot be correctly tracked and positioned only relying on syndrome information. To enable QC to be performed smoothly, it is necessary to perform decoding immediately after error syndromes are obtained and to complete the error correction before each computation step of a quantum algorithm is run (or before a next round of error correction is started). This process, referred to as real-time error correction, is an indispensable technology for implementing large-scale general QC.

Real-time error correction has a very high rigid requirement on margin of a running time of a decoding algorithm of a QEC code, but decoding algorithms of some current QEC codes cannot meet the requirement of real-time error correction.

SUMMARY

Embodiments of this application provide a neural network-based quantum error correction decoding method and apparatus, and a chip, which can reduce a decoding time of a decoding algorithm of a quantum error correction code, thereby meeting the requirements of real-time error correction. The technical solutions are as follows.

According to an aspect, the embodiments of this application provide a neural network-based quantum error correction decoding method, including:

obtaining error syndrome information of a quantum circuit, the error syndrome information being a data array formed by eigenvalues of a stabilizer generator of a quantum error correction code;

performing block feature extraction on the error syndrome information by using a neural network decoder, to obtain feature information, a feature extraction layer of the neural network decoder being configured to perform block feature extraction on inputted data, the block feature extraction referring to that after the inputted data is partitioned into at least two blocks, parallel feature extraction processing is performed on the at least two blocks by using at least two feature extraction units; and performing fusion decoding processing on the feature information by using the neural network decoder, to obtain error result information, the error result information being used for determining a data qubit in which an error occurs in the quantum circuit and a corresponding error type.

According to another aspect, the embodiments of this application provide a neural network-based quantum error correction decoding method, applicable to a computer device, the method including:

obtaining error syndrome information of a quantum circuit, the error syndrome information being a data array formed by eigenvalues of a stabilizer generator of a quantum error correction code:

performing block feature extraction on the error syndrome information by using a neural network decoder, to obtain feature information, a feature extraction layer of the neural network decoder being configured to perform block feature extraction on inputted data, the block feature extraction referring to that after the inputted data is partitioned into at least two blocks, parallel feature extraction processing is performed on the at least two blocks by using at least two feature extraction units; and performing fusion decoding processing on the feature information by using the neural network decoder, to obtain error result information, the error result information being used for determining a data qubit in which an error occurs in the quantum circuit and a corresponding error type.

According to another aspect, the embodiments of this application provide a neural network-based quantum error correction decoding apparatus, including:

a syndrome information obtaining module, configured to obtain error syndrome information of a quantum circuit, the error syndrome information being a data array formed by eigenvalues of a stabilizer generator of a quantum error correction code:

a block feature extraction module, configured to perform block feature extraction on the error syndrome information by using a neural network decoder, to obtain feature information, a feature extraction layer of the neural network decoder being configured to perform block feature extraction on inputted data, the block feature extraction referring to that after the inputted data is partitioned into at least two blocks, parallel feature extraction processing is performed on the at least two blocks by using at least two feature extraction units; and a fusion decoding processing module, configured to perform fusion decoding processing on the feature information by using the neural network decoder, to obtain error result information, the error result information being used for determining a data qubit in which an error occurs in the quantum circuit and a corresponding error type.

According to another aspect, the embodiments of this application provide a computer device, including a processor and a memory, the memory storing at least one instruction, at least one program, a code set or an instruction set, and the at least one instruction, the at least one program, the code set or the instruction set being loaded and executed by the processor to implement the neural network-based quantum error correction decoding method.

According to another aspect, the embodiments of this application provide a computer-readable storage medium, storing at least one instruction, at least one program, a code set or an instruction set, and the at least one instruction, the at least one program, the code set or the instruction set being loaded and executed by a processor to implement the neural network-based quantum error correction decoding method.

According to still another aspect, the embodiments of this application provide a chip, including a programmable logic circuit and/or a program instruction, when running on a computer device, the chip being configured to implement the neural network-based quantum error correction decoding method.

According to still yet another aspect, the embodiments of this application provide a computer program product, when executed, the computer program product being configured to implement the neural network-based quantum error correction decoding method.

The technical solutions provided in the embodiments of this application may include at least the following beneficial effects:

Block feature extraction is performed on error syndrome information of a quantum circuit, to obtain a plurality of groups of feature information, and then fusion decoding processing is further performed on the plurality of groups of feature information, to obtain error result information. Since a block feature extraction manner is used, compared with complete feature extraction on inputted data, on one hand, a quantity of channels of feature information obtained by each feature extraction is reduced, and inputted data of next feature extraction is reduced, which helps to reduce a quantity of feature extraction layers in a neural network decoder, thereby shortening the depth of the neural network decoder. Because the depth of the neural network decoder is shortened, a decoding time used by the neural network decoder is correspondingly reduced. On the other hand, when block feature extraction is performed, parallel feature extraction processing is performed on a plurality of blocks by using a plurality of feature extraction units, that is, the plurality of feature extraction units may synchronously (or referred to as simultaneously) perform feature extraction processing, which helps to reduce the time consumed by feature extraction, thereby reducing the decoding time. Finally, with reference to the two factors, when quantum error correction decoding is performed by using the neural network decoder, the decoding time is fully reduced, thereby meeting the requirements of real-time error correction.

BRIEF DESCRIPTION OF THE DRAWINGS

To describe technical solutions in embodiments of this application more clearly, the following briefly introduces the accompanying drawings required for describing the embodiments. Apparently, the accompanying drawings in the following description show only some embodiments of this application, and a person of ordinary skill in the art may still derive other drawings from these accompanying drawings without creative efforts.

DESCRIPTION OF EMBODIMENTS

Figure 1:
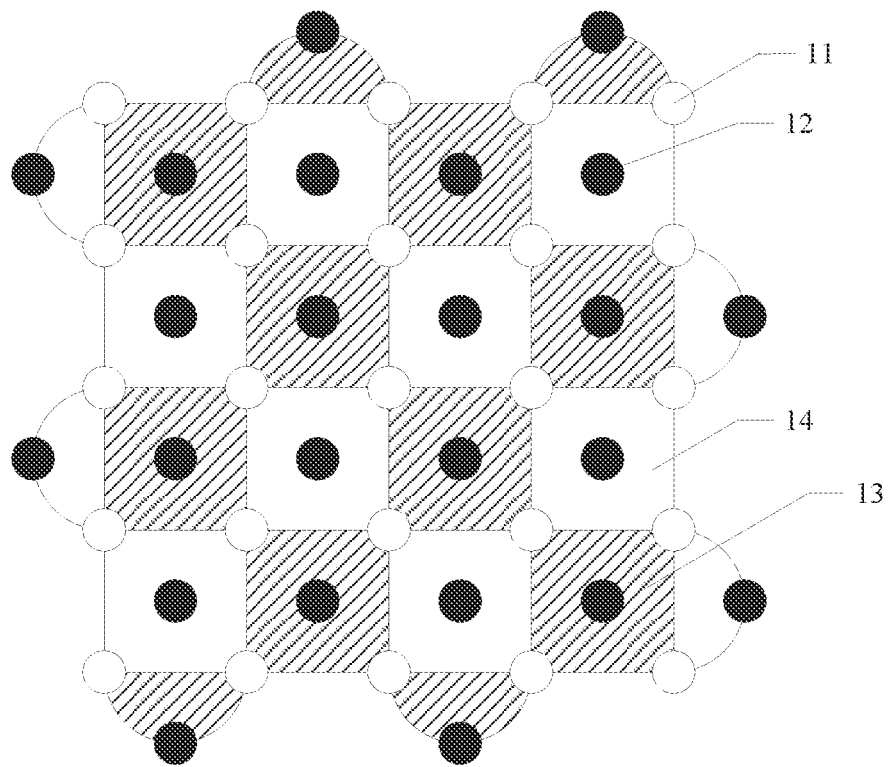
FIG. 1 is a schematic structural diagram of a surface code according to an embodiment of this application.

To make the objectives, technical solutions, and advantages of this application clearer, implementations of this application are further described below in detail with reference to the accompanying drawings.

Before the embodiments of this application are described, some terms involved in this application are explained first.

1. Quantum computation (QC): QC is a scheme of using superposition and entanglement properties of quantum states to rapidly complete a specific computation task.

2. Quantum teleportation: Quantum teleportation is a technology of transporting any unknown quantum state by any distance in a manner of distributing quantum entangled states and transmitting some classic information.

3. Quantum error correction (QEC) code: A QEC code is a scheme of mapping a quantum state to a subspace in the Hilbert space of a many-body quantum system for encoding. Quantum noise may cause an encoded quantum state to be transferred to another subspace. By continuously observing a space in which a quantum state is localized (syndrome extraction), quantum noise can be evaluated and corrected without interfering with the encoded quantum state, to protect the encoded quantum state against interference from the quantum noise. Specifically, for a QEC code [[n,k,d]], it represents that k logic qubits in n physical qubits are encoded, to correct any $\lfloor (d-1)/2 \rfloor$ errors that occur on any single qubit.

4. Data quantum state: A data quantum state is a quantum state of a data qubit used for storing quantum information during QC.

5. Stabilizer generator: A stabilizer generator is also referred to as a parity check operator. The occurrence of quantum noise (an error) may change eigenvalues of some stabilizer generators, and therefore QEC may be performed based on the information.

6. Stabilizer group: A stabilizer group is a group generated by stabilizer generators. If there are k stabilizer generators, a stabilizer group includes $2^k$ elements, which is an abelian group.

7. Error syndrome: If there is no error, an eigenvalue of a stabilizer generator is 0; and when quantum noise occurs, eigenvalues of stabilizer generators (parity check operators) of some error correction codes are changed to 1. A bit string formed by syndrome bits 0 and 1 is referred to as an error syndrome.

8. Syndrome measurement circuit: A syndrome measurement circuit is also referred to as a check circuit, and is a quantum circuit for obtaining an error syndrome. Generally, the circuit is contaminated with noise.

9. Topological QEC code: A topological QEC code is a special class in a QEC code. Qubits of such error correction codes are distributed on a grid array of which a quantity of dimensions is greater than two. The grid forms a discrete structure of a high-dimensional manifold. In this case, a stabilizer generator of the error correction code is defined on geometrically neighbor and limited qubits, and therefore is geometrically localized and easily measurable. Qubits acted by logical operators of the error correction codes form a topological non-trivial geometric object on the manifold of the grid array.

10. Surface code: A surface code is a class of topological QEC code defined on a two-dimensional manifold. A stabilizer generator of the surface code is generally supported by four qubits (supported by two qubits at a boundary) and a logical operator is a non-trivial chain of a strip spanning array. A specific two-dimensional structure (5*5, a total of 25 data qubits and 24 auxiliary qubits, which can correct any error that occurs on two qubits) of the surface code is shown in FIG. 1: white circles 11 represent data qubits for performing QC, and black circles 12 represent auxiliary qubits. The auxiliary qubits are initially prepared in a $|0\rangle$ or $|+\rangle$ state. Squares (or semicircles) 13 filled with slashes and squares (or semicircles) 14 filled with white represent two different types of stabilizer generators, which are respectively configured to detect a Z error and an X error. In this application, a rotated surface code shown in FIG. 1 is used. The rotated surface code may save approximately half of physical qubits, and therefore is more conveniently verified in recent experiments.

11. Length L of surface code: A length L of a surface code is a quarter of a perimeter of a surface code array. As shown in FIG. 1, a length L of a surface code is L=5.

12. Stabilizer code: A stabilizer code is a QEC code defined by a group of stabilizer generators. The stabilizer generators are a group of Pauli-operators that are mutually commutative and independently act on n qubits. An eigensubspace with a common eigenvalue of +1 of the group of Pauli-operators is an encoding space of the stabilizer code.

13. Homology class: In topology, a homology class in a homology theory is represented by a finite linear combination of geometric sub-objects with a boundary of 0. If a geometric object of this linear combination may be considered as a boundary of a geometric object of which a dimension is greater than one, it is considered that the geometric object is homologous with "0" (0 herein refers to a topological trivial class, which may be a geometric object that can be continuously contracted to a point). In the following, the homology class is sometimes mixed with an "error class".

14. X and Z errors: An X error and a Z error are a Pauli-X evolution error and a Pauli-Z evolution error that are randomly generated on a quantum state of a physical qubit. According to the QEC theory, provided that an error correction code can be used to correct an X error and a Z error, the error correction code can be used to correct any error that occurs on a single qubit.

15. Fault tolerant quantum error correction (FTQEC): FTQEC is all operation processes during real QC and includes a quantum gate and quantum measurement that contain noise. That is, even a circuit for QEC also contains noise. FTQEC refers to that after an error correction circuit may be well designed, error correction may be performed by using the error correction circuit with noise, and the purposes of correcting an error and preventing the error from spreading over time can be still achieved.

16. Fault tolerant quantum computation (FTQC): FTQC is QC under QEC protection. During QC, there is noise in any physical operation, including an operation on a QEC circuit itself and qubit measurement. In addition, it is assumed that there is no noise in a classic operation. FTQC is a technical solution in which a method of properly designing a QEC scheme and performing a gate operation in a specific manner on an encoded logic quantum state is used to ensure effective control and error correction during QC using qubits with noise.

17. Physical qubit: A physical qubit is a qubit implemented by using an actual physical device.

18. Logic qubit: A logic qubit is a mathematical degree of freedom in the Hilbert subspace defined by an error correction code. The description of a quantum state of the logic qubit is usually a many-body entangled state, which is generally a two-dimensional subspace of a plurality of physical qubits combined with a Hilbert space. FTQC needs to be run on a logic qubit protected by an error correction code.

19. Physical quantum gate/circuit: A physical quantum gate/circuit is a quantum gate/circuit that works on a physical qubit.

20. Logic quantum gate/circuit: A logic quantum gate/circuit is a quantum gate/circuit that works on a logic qubit.

21. Data error: A data error is an error that occurs on a data qubit.

22. Measurement error: A measurement error is an error caused by an imperfect measurement process.

23. Threshold theorem: In a threshold theorem, for a computation scheme that meets an FTQC requirement, when error rates of all operations are less than a threshold, a better error correction code, more qubits, and more quantum operations may be used to enable the accuracy of computation to arbitrarily approximate to I. Meanwhile, additional resource overheads may be ignored relative to the index acceleration of QC.

24. Neural network: An artificial neural network is an adaptive nonlinear dynamic system formed by a large quantity of simple basic elements, that is, neurons, connected to each other. A structure and a function of each neuron are relatively simple, but a system behavior generated by a combination of a large quantity of neurons is very complex, and in principle, any function may be expressed.

25. Convolutional neural network (CNN): CNN is a type of feedforward neural network including convolutional computation and having a deep structure. A convolutional layer is a keystone of the CNN, that is, a discrete two-dimensional or three-dimensional filter (also referred to as a convolution kernel, which is respectively a two-dimensional or three-dimensional matrix) that performs a convolution operation with a two-dimensional or three-dimensional data lattice.

26. Rectifies linear unit layer (ReLU layer): A ReLU f(x)=max (0, x) is used as an activation function of a neural network.

27. Error back propagation (BP) algorithm: An error BP algorithm is a supervised learning algorithm in an artificial neural network. A BP neural network algorithm can approach to any function theoretically, and a basic structure is formed by nonlinear change units and has a strong nonlinear mapping capability.

28. Field programmable gate array (FPGA).

The technical solution of this application relates to the field of quantum technologies and artificial intelligence technologies. Artificial Intelligence (AI) is a theory, method, technology, and application system that uses a digital computer or a machine controlled by the digital computer to simulate, extend, and expand human intelligence, perceive an environment, acquire knowledge, and use knowledge to obtain an optimal result. In other words, AI is a comprehensive technology in computer science and attempts to understand the essence of intelligence and produce a new intelligent machine that can react in a manner similar to human intelligence. AI is to study design principles and implementation methods of various intelligent machines, to enable the machines to have functions of perception, reasoning, and decision-making.

The AI technology is a comprehensive subject, relating to a wide range of fields, and involving both hardware and software techniques. Basic AI technologies generally include technologies such as a sensor, a dedicated AI chip, cloud computing, distributed storage, a big data processing technology, an operating/interaction system, and electromechanical integration. AI software technologies mainly include several major directions such as a computer vision (CV) technology, a speech processing technology, a natural language processing technology, and machine learning (ML)/deep learning.

ML is a multi-field interdiscipline, and relates to a plurality of disciplines such as the probability theory, statistics, the approximation theory, convex analysis, and the algorithm complexity theory. The ML specializes in studying how a computer simulates or implements a human learning behavior to obtain new knowledge or skills, and reorganize an existing knowledge structure, so as to keep improving performance of the computer. The ML, as the core of AI, is a basic way to make the computer intelligent, and is applicable to various fields of AI. The ML and deep learning generally include technologies such as an artificial neural network, a belief network, reinforcement learning, transfer learning, inductive learning, and learning from demonstrations.

With the research and progress of the AI technology, the AI technology is studied and applied in a plurality of fields such as a common smart home, a smart wearable device, a virtual assistant, a smart speaker, smart marketing, unmanned driving, automatic driving, an unmanned aerial vehicle, a robot, smart medical care, and smart customer service. It is believed that with the development of technologies, the AI technology will be applied to more fields, and play an increasingly important role.

The solutions provided in the embodiments of this application relate to the application of a machine learning technology of AI in the field of quantum technologies, and in particular, to the application of the machine learning technology in a decoding algorithm of a quantum error correction code, and are specifically described by using the following embodiments.

Generally, a long-distance quantum gate needs to be introduced for measuring (also referred to as parity check) a stabilizer generator of a QEC code, and meanwhile, a complex quantum auxiliary state is required to prepare by using an additional qubit to complete fault tolerant and error correction. Due to the limitation of current experimental means, people cannot realize a high-precision long-distance quantum gate, and also cannot prepare a complex quantum auxiliary state. The solution of performing FTQEC and FTQC by using a surface code does not require the use of the long-distance quantum gate and the preparation of the complex quantum auxiliary state, so it is considered that it is very possible to implement a general fault tolerant quantum computer by using a current technology.

As an error correction code, after an error occurs, parity check may be performed to obtain error syndromes, and then an occurrence position and a type (which is an X error, a Z error, or both, that is, a Y error) of the error need to be further determined by using a specific decoding algorithm for the error correction code and according to the syndromes. For a surface code, an error and an error syndrome have specific spatial positions. When there is an error and a syndrome is caused, an eigenvalue of an auxiliary qubit at a corresponding position is 1 (which may be considered that a dot particle appears at the position). When there is no error, an eigenvalue of an auxiliary qubit at a corresponding position is 0. In this case, the decoding may be summarized as the following: A spatial digital array (which is two-dimensional or three dimensional, and a value is 0 or 1) is given, qubits in which errors are most likely to occur and specific error types are inferred according to a specific error occurrence model and a probability distribution of errors occurring on the qubits, and error correction is performed according to the inference result.

Figure 2:
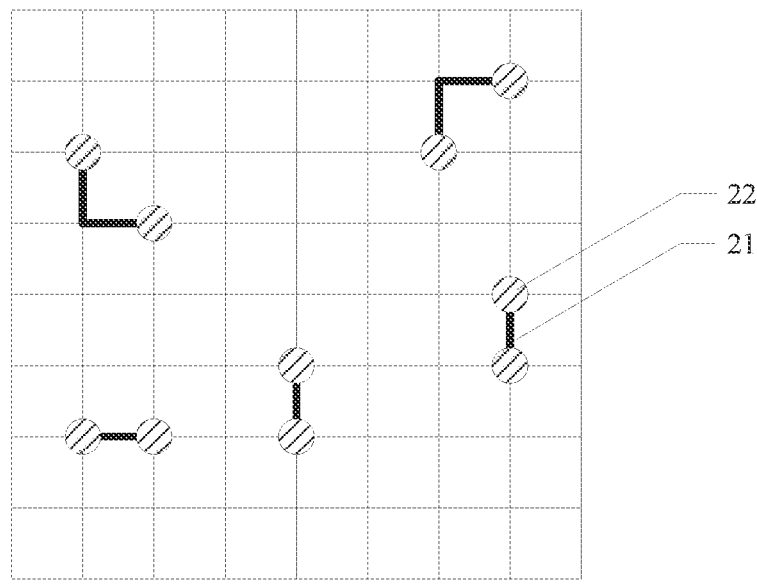
FIG. 2 is a schematic diagram in which an error occurs in a surface code according to an embodiment of this application.

FIG. 2 is a schematic diagram in which an error occurs on a surface code. Qubits are on an edge of a two-dimensional array, and auxiliary qubits for measuring error syndromes are on nodes of the two-dimensional array (the syndromes are obtained through perfect syndrome). In FIG. 2, a black edge 21 represents an error chain formed by qubits in which errors occur, and a circle part 22 filled with slashes represents a point in which a syndrome value caused by an error is 1. Decoding can be completed provided that a chain error can be determined by punctate syndromes.

As described above, error syndrome information may be decoded by using a decoding algorithm (or may be referred to as a decoder) of an error correction code, to obtain corresponding error result information such as an occurrence position and a type of an error. A decoding capability of a decoder may be measured from the following four key indicators: complexity of a decoding algorithm, a decoding time, decoding performance, and whether it is applicable for real-time error correction.

Complexity of a decoding algorithm: Complexity of a decoding algorithm refers to computational complexity corresponding to total basic computational steps required for operation of the decoding algorithm.

Decoding time: Time herein is a virtual concept, which is different from a real decoding time but has a strong correlation with the real decoding time. The decoding time herein refers to an algorithm depth after the decoding algorithm is fully parallelized.

Decoding performance. Decoding performance is measured by an error rate on a logic qubit after decoding is performed by using a specific noise model. For an error rate of the same physical qubit, a lower logic error rate indicates better decoding performance.

Applicable for real-time error correction: Because a service life of a qubit is relatively short (for example, a service life of a superconducting qubit is approximately 50 microseconds under a good process, and because errors are gradually accumulated with time when occurring, it is theoretically required that a time consumed by the entire error correction process is less than $\frac{1}{100}$ of the service life of the superconducting qubit, that is, a rigid margin of the error correction time is around 500 ns, and otherwise an error occurrence rate may exceed an error correction capability of the surface code), a central processing unit (CPU) and a graphics processing unit (GPU) have a long time delay caused by the uncertainty of a reading and writing time of a memory and cannot meet the requirements, and a computational microstructure of the CPU/GPU is not optimized for the decoding algorithm, so it is difficult to achieve the performance indicator. This application considers that the decoding algorithm is transplanted into a specific computing device such as a field programmable gate array (FPGA) or an application specific integrated circuit (ASIC). Such a device is more suitable for performing simple steps for parallelization (for example, a vector inner product or matrix multiplication) and is not suitable for running a complex instruction with condition determining and jump. Finally, because most of a chip area of the FPGA/ASIC is used for real-time computation, an area that may be reserved for on-chip cache is limited, which requires not to preload excessive data on the chip.

By constructing a decoder (which may be referred to as a neural network decoder) based on a neural network, error syndrome information is decoded to obtain corresponding error result information. Because the decoding process is a function of an input (error syndrome information) and an output (error result information), a neural network may be constructed and the neural network is trained by using a correct input/output result, to learn (supervised learning) how to determine a position and a type of an error. The neural network decoder may be classified into two types according to different output types of the neural network decoder: one is a physical level and the other is a logic level. A model outputted by the physical level directly generates specific information about a qubit in which an error occurs, that is, which type of error occurs in a specific data qubit. A model outputted by the logic level outputs a logic error class (which is a homology class for a surface code) after a specific error is specifically mapped, and then an equivalent error specifically occurring on a data qubit may be deduced according to the logic error class (the deduced error is not necessarily the same as an originally occurred error, but has the same effect as the originally occurred error, and this is an error degeneracy phenomenon specific to a quantum error correction code). A common neural network decoding algorithm uses a fully connected network, a CNN, a recurrent neural network (RNN), or the like. Most of operations of the neural network are matrix operations, and the neural network may be highly parallelized, is very suitable for running on specific hardware (for example, the FPGA or the ASIC) in a short real-time computing time, and has great practical application potential.

The complexity of the decoding algorithm, the decoding time, the decoding performance, and whether is applicable for real-time error correction of the neural network decoder all depend on a selected neural network model and are related to whether a physical-level output or a logic-level output is used. There are great differences between aspects of different neural networks. A neural network model is relatively easily constructed when the length of the surface code is relatively small, and the decoding performance can generally far exceed the performance of a minimum weight perfect match (MWPM) decoding algorithm and is close to an optimal decoder. However, the current neural network model generally cannot decode a large-length surface code because a quantity of samples required by the neural network to pre-train such a surface code rises with L (that is, the length of the surface code described above) exponentially. Meanwhile, a depth of the known neural network for the large-length surface code is large, and the neural network is not necessarily suitable for real-time error correction. On the other hand, although the neural network algorithm is very suitable for implementation by using the FPGA/ASIC, the decoding time is not fixed for a physical-level decoder and is very long in an extreme case.

Compared with another decoding algorithm, the neural network decoder can achieve good decoding performance for a small-length surface code, and the decoding time used is relatively short. On the basis of a neural network algorithm framework, the technical solution of this application attempts to resolve the problem faced by the neural network algorithm. The neural network decoder provided by the technical solution of this application adopts a concept similar to divide and conquer to perform block feature extraction on error syndrome information. In this way, it can be ensured that a depth of the neural network is shallow, and a lower bound of a decoding time is given due to the depth. In addition, the neural network decoder may use a logic-level output to help reduce the complexity of the neural network, so that the decoding time is further reduced. Meanwhile, to meet the requirement of real-time error correction, a network structure designed by the technical solution of this application is also simple, and all basic computations (matrix multiplication and addition) can be conveniently and directly completed through hardware parallelization. In addition, a total quantity of network parameters increases gently with a size of a corresponding surface code (increases with L as a polynomial at most, and all network parameters need to be pre-loaded into an FPGA/ASIC for on-chip cache, so the quantity of parameters cannot be too much). In addition, a quantity of samples and a data volume used for training the neural network decoder to achieve the required decoding performance also increase gently with L. In this way, the decoder is scalable. Numerical simulation shows that the decoding performance of the decoder exceeds that of the MWPM when L is not large, and the decoder has good decoding performance.

Figure 3:
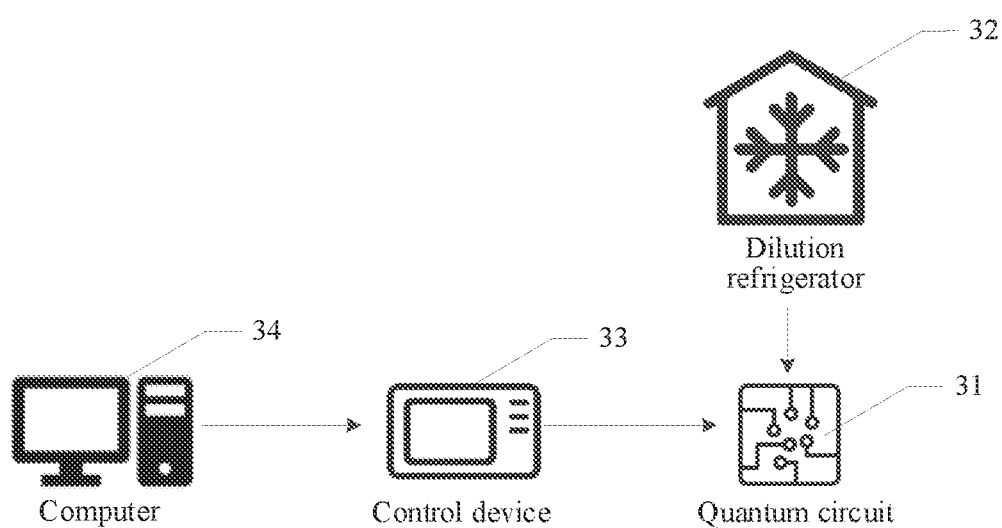
FIG. 3 is a schematic diagram of an application scenario of a solution according to an embodiment of this application.

FIG. 3 is a schematic diagram of an application scenario of a solution according to an embodiment of this application. As shown in FIG. 3, the application scenario may be a superconducting quantum computing platform and includes: a quantum circuit 31, a dilution refrigerator 32, a control device 33, and a computer 34.

The quantum circuit 31 is a circuit acting on a physical qubit, and the quantum circuit 31 may be implemented as a quantum chip such as a superconducting quantum chip at around absolute zero. The dilution refrigerator 32 is configured to provide an absolute zero environment for the superconducting quantum chip.

The control device 33 is configured to control the quantum circuit 31, and the computer 34 is configured to control the control device 33. For example, a written quantum program is compiled into an instruction by using software in the computer 34 and sent to the control device 33, and the control device 33 converts the instruction into an electronic/microwave control signal and inputs the electronic/microwave control signal to the dilution refrigerator 32 to control a superconducting qubit at 10 mK. A reading process is opposite.

Figure 4:
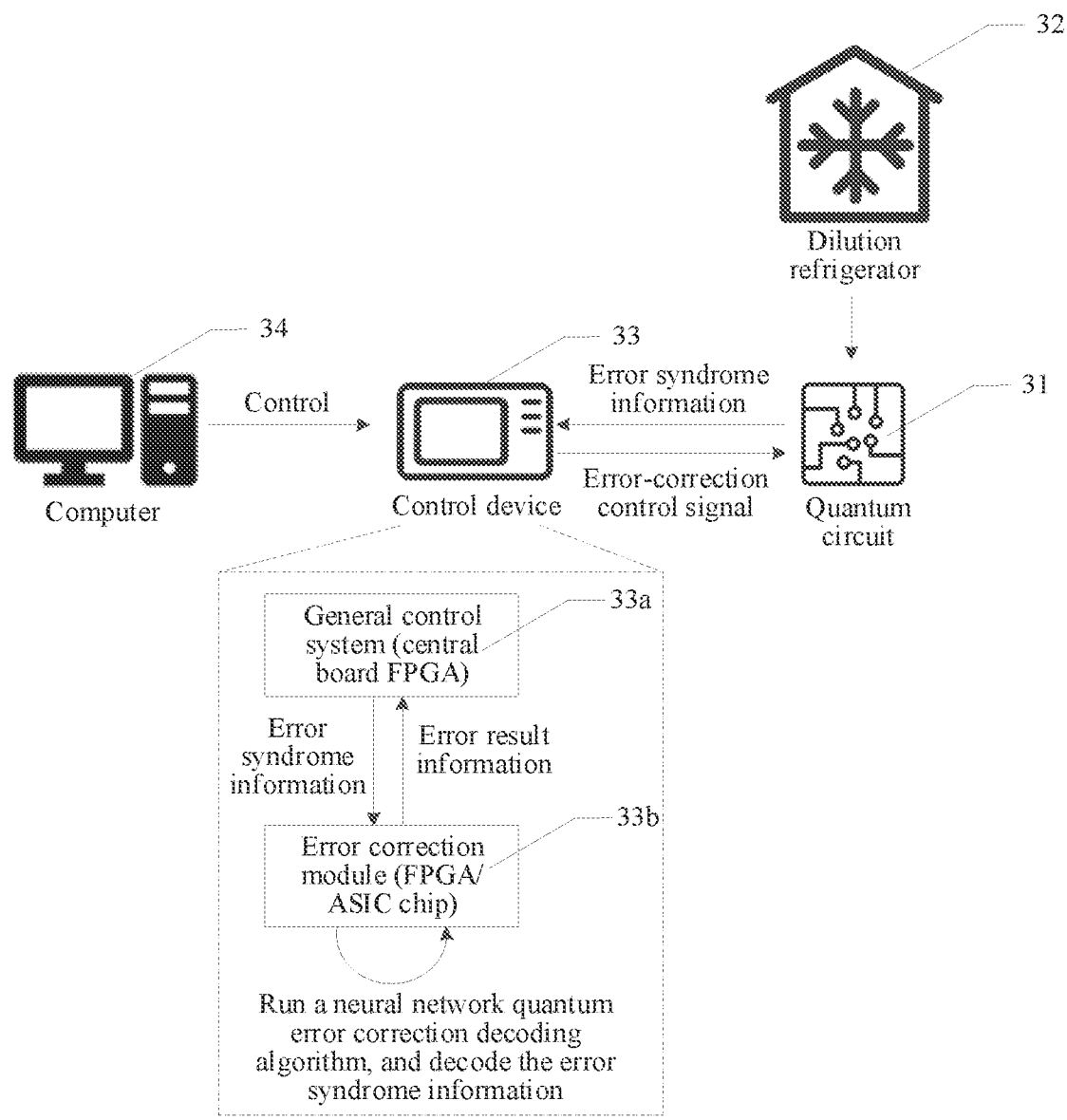
FIG. 4 is a schematic diagram of an error correction decoding process involved in the application scenario of the solution shown in FIG. 3.

As shown in FIG. 4, the neural network-based QEC decoding method provided in the embodiments of this application needs to be combined with the control device 33. After a general control system 33a (for example, a central board FPGA) of the control device 33 reads error syndrome information from the quantum circuit 31, the general control system 33a sends an error correction instruction to an error correction module 33b of the control device 33, the error correction instruction includes the error syndrome information of the quantum circuit 31, and the error correction module 33b may be an FPGA or ASIC chip. The error correction module 33b operates a neural network-based QEC decoding algorithm, decodes the error syndrome information, converts in real time error result information obtained through the decoding into an error-correction control signal, and sends the error-correction control signal to the quantum circuit 31 for error correction.

For ease of subsequent description, a basic algorithm for decoding a QEC code is first described herein. As an error correction code, after an error occurs, an error syndrome may be obtained by performing parity check. An occurrence position and a type (which is an X error, a Z error, or both, that is, a Y error) of the error need to be further determined by using a specific decoding algorithm for the error correction code and according to the syndromes. That is, the decoding process may be equivalent to that an error occurrence model (probability distribution of errors that occur on qubits) and a syndrome obtained through single measurement are given, and it is inferred what is the most likely error to occur.

Different from a general error correction code, an error and a syndrome of a surface code have geometric meanings. For the surface code, if an error in an error correction process is not considered (that is, if a measurement process is perfect, the syndrome is referred to as a perfect syndrome), the error syndrome may be considered as a two-dimensional array image formed by 0 and 1. For the surface code, positions and types of the errors are determined according to positions of the syndromes. According to the QEC theory, there are two types of errors that need to be corrected, that is, an X error and a Z error. In this way, there are corresponding syndromes associated with the X error and the Z error. The X error and the Z error may be corrected respectively, and the two types of syndromes are corrected in a similar manner. A more optimal solution is to be that both the X error and the Z error are corrected simultaneously. Because in many cases, the two types of errors are correlated (the MWPM cannot use the correlation between the syndromes of the two types of errors simultaneously). For a noise-free (perfect) error syndrome, a maximum A posterior (MAP) estimation algorithm is first introduced, which is also an optimal algorithm.

S is defined as a stabilizer group of a [[n,k,d]] QEC code, and L is defined as a normalizer class of S in an n-bit Pauli group. Any occurred Pauli error E may be dismantled into:

$E=L(E)T(S(E))$.

Herein, $L(E) \in L$ means that L(E) belongs to a normalizer class L and is a function of E, S(E) is a syndrome of the error E and is an error mapped according to an error syndrome, an error set is generated through the mapping and is in one-to-one correspondence with a syndrome set. T(S(E)) is referred to as a simple error correction, and elements in the error set are referred to as simple errors. Selection of T(S(E)) has great arbitrary, but some specific selection manners facilitate a better understanding. This is not expanded herein. For another error E', if E and E' have the same error syndrome, E' is expressed as follows:

$E'=L(E')T(S(E')=S(E))$.

Provided that both L(E') and L(E) belong to the same normalizer class L, the two errors only differ by elements in one stabilizer group, that is, effects of the two errors on an encoding space are equivalent. E' may be selected for performing error correction on E (that is, E is an actually occurred error, but may be actually corrected according to E' because both are equivalent), and have the same effect. For a topological QEC code represented by a surface code, different normalizer classes L represent different topological homology classes to which operators belong. For a topological error correction code, a term such as a "homology class" or an "error class" is used for representing a normalizer class in the following. Errors belonging to the homology class do not generate any error syndrome (all error syndromes are 0), so the errors are equivalent to logic errors. The reason is that an error belonging to the homology class is mathematically a logic error. Logic errors occur in the encoding space, and results obtained by performing syndrome measurement on the logic errors are all 0.

Therefore, an occurred error E is given, an inference process of a MAP decoder may be expressed as:

$$\tilde{L} = \operatorname{argmax}_L \sum_{l \in L} Pr(lT(s(E))).$$

That is, only a normalizer class to which the error most likely belongs after a simple error is removed needs to be determined, and then any element in the normalizer class is selected to multiply an output error of a simple decoder to obtain an error that needs to be corrected. That is, the decoding problem is equivalent to a classification problem. For a surface code, three classes corresponding to the normalizer class are three operators of X, Y, and Z of a logic qubit and a set of equivalent operators of X, Y, and Z. This can be resolved (approximate to an optimal solution) exactly effectively by a high-performance neural network classifier.

After a homology class $\tilde{L}$ is estimated with high accuracy, because an error syndrome is perfect, a simple error $T(S(E))$ may be obtained immediately, and the simple error is multiplied by any element $\tilde{L}_r$ in the $\tilde{L}$ to obtain an error that needs to be corrected:

$$\tilde{E}=\tilde{L}_rT(S(E))\quad\text{(the formula is recorded as "formula 1")}.$$

Compared with a general error correction code, an error and a syndrome of a surface code have geometric meanings. For the surface code, if an error in an error correction process is not considered (that is, if the entire syndrome measurement process is perfect, the error syndrome information is referred to as perfect error syndrome information), error syndrome information may be considered as a two-dimensional array image formed by 0 and 1. For the surface code, error correction refers to that positions and types of the errors are determined according to positions of the syndromes. For convenience of subsequent writing, a class of simple decoder having a geometric meaning is introduced herein. The simple decoder, which is referred to as a "minimum boundary distance" decoder, may provide a more intuitive description for understanding a fault-tolerant error-correction decoding framework. Because a parity check operator of the surface code respectively detects an X error and a Z error and the two errors are symmetrical, only one of the two errors is considered, which is assumed to be the Z error. For a rotated surface code, any syndrome bit with a value of 1 is considered to be generated by an X operator chain (error chain) and a function of the chain is to connect a syndrome point to one of two boundaries. A syndrome point with the smallest distance from the boundary in all these chains is obtained and a simple error corresponding to the syndrome point is recorded. For an L*L rotated surface code, and for an X-class error, $(L^2-1)/2$ syndromes with values of 1 need to be decoded by using the "minimum boundary distance" decoder, and simple errors corresponding to the syndromes are recorded as:

$$\{E_\alpha|\alpha=1,\ldots(L^2-1)/2\}.$$

Subsequently, when syndromes $\{S_1,\ldots S_{(L^2-1)/2}\}$, $(S_\alpha=0, 1)$ are obtained through measurement, a decoding output of a simple decoder is defined as $E_S=\Pi_\alpha E_\alpha^{S_\alpha}$, that is, a product of all simple errors with syndrome bits of 1. Similarly, for a Z-class error, $(L^2-1)/2$ syndromes with values of 1 also need to be decoded by using the "minimum boundary distance" decoder, and simple errors corresponding to the syndromes are recorded. Finally, a mapping table containing $(L^2-1)$ groups of mapping relationships is constructed, and each group of mapping relationships includes a mapping relationship between an error syndrome point and a simple error. The simple decoding process may be performed in parallel (which is essentially a process of performing summation after a table look-up process), and in an actual case, the time complexity may be O(1).

The complexity of performing decoding by using the MAP or the optimal algorithm is at NP-complete, that is, the optimal solution is approached by using an approximate method. Various decoding algorithms for QEC codes may be considered as an approximation to the optimal solution. The technical solution of this application mainly adopts a neural network decoder for approximation.

Before the method embodiment of this application is described, a running environment (or referred to as an execution body) of the method is described first. The neural network-based QEC decoding method according to this embodiment of this application may be implemented by a classic computer (for example, a personal computer (PC), a server or a computing host). For example, a classic computer is used to execute a corresponding computer program to implement the method. The method may be alternatively performed by a quantum computer. The method may be alternatively performed in a hybrid device environment of a classic computer and a quantum computer. For example, a quantum computer performs steps of obtaining error syndrome information of a quantum circuit and the like, and then the classic computer performs the steps of performing block feature extraction and fusion decoding processing on the error syndrome information, to obtain error result information and the like, with the reason that a corresponding computation result of performing the method is theoretically supposed to be better by directly deploying a quantum circuit on the quantum computer, instead of simulating the quantum circuit on the classic computer.

In the following method embodiment, for ease of description, the description is provided by merely using a computer device (for example, a control device of the application scenario shown in FIG. 3) as the execution body of the steps. It is to be understood that the computer device may be a classic computer or may be a quantum computer, or may be a hybrid execution environment including a classic computer and a quantum computer. This is not limited in the embodiments of this application.

Next, the technical solution of this application is described by using several embodiments.

Figure 5:
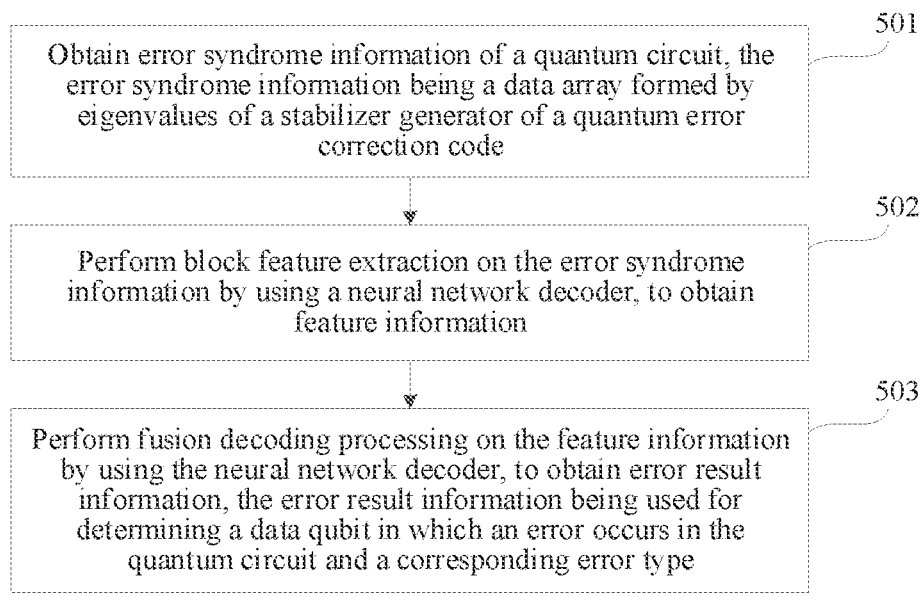
FIG. 5 is a flowchart of a neural network-based quantum error correction decoding method according to an embodiment of this application.

FIG. 5 is a flowchart of a neural network-based quantum error correction decoding method according to an embodiment of this application. The method is applicable to a control device in the application scenario shown in FIG. 3. The method may include the following steps (501 to 503).

Step 501. Obtain error syndrome information of a quantum circuit, the error syndrome information being a data array formed by eigenvalues of a stabilizer generator of a QEC code.

Error syndrome measurement may be performed on a quantum circuit by using a QEC code, to obtain corresponding error syndrome information. The error syndrome information is a data array formed by eigenvalues of a stabilizer generator of the QEC code. In some embodiments, the error syndrome information is a two-dimensional or a three-dimensional data array formed by 0 and 1. For example, w % ben there is no error, an eigenvalue of a stabilizer generator is 0; and when there is an error, an eigenvalue of the stabilizer generator is 1.

Figure 6:
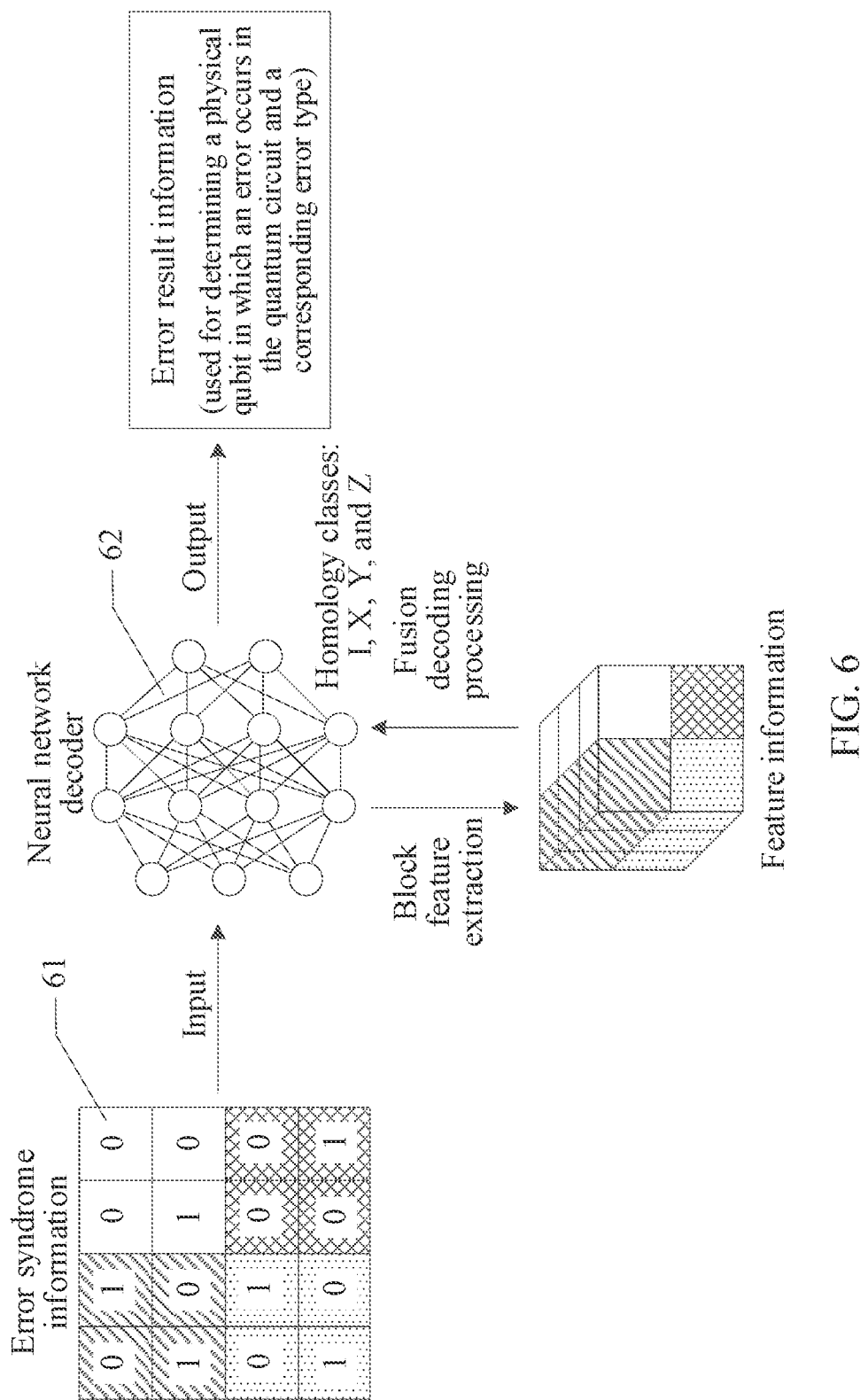
FIG. 6 is a schematic diagram of block feature extraction according to an embodiment of this application.

For example, the QEC code is a surface code. For a surface code, an error and an error syndrome have specific spatial positions. When there is an error and a syndrome is caused, an eigenvalue of an auxiliary qubit at a corresponding position is 1 (which may be considered that a dot particle appears at the position). When there is no error, an eigenvalue of an auxiliary qubit at a corresponding position is 0. Therefore, for the surface code, if an error in an error correction process is not considered (that is, if a measurement process is perfect, the syndrome is referred to as a perfect syndrome), the error syndrome information may be considered as a two-dimensional array image formed by 0 and 1, as shown in FIG. 6.

Step 502. Perform block feature extraction on the error syndrome information by using a neural network decoder, to obtain feature information.

Step 503. Perform fusion decoding processing on the feature information by using the neural network decoder, to obtain error result information, the error result information being used for determining a data qubit in which an error occurs in the quantum circuit and a corresponding error type.

The neural network decoder is a machine learning model that is constructed based on a neural network and is configured to decode the error syndrome information. Inputted data of the neural network decoder is error syndrome information, and outputted data is error result information corresponding to the error syndrome information. The neural network decoder performs feature extraction on the error syndrome information by using a divide-and-conquer idea in a block feature extraction manner. That is, a feature extraction layer of the neural network decoder is configured to perform block feature extraction on the inputted data. The block feature extraction refers to that when extracting feature information, the feature extraction layer of the neural network decoder divides the inputted data into a plurality of blocks and respectively performs feature extraction on the blocks. That is, the block feature extraction refers to that after the inputted data is partitioned into at least two blocks, parallel feature extraction processing is performed on the at least two blocks by using at least two feature extraction units. The at least two blocks are in one-to-one correspondence with the at least feature extraction units. Each feature extraction unit is configured to perform feature extraction on one block, and a quantity of blocks is the same as a quantity of feature extraction units. In addition, the feature extraction is performed on the at least two blocks in parallel, that is, the feature extraction is simultaneously performed on the at least two blocks, thereby helping reduce a time consumed by the feature extraction.

A case of obtaining a perfect error syndrome may be first considered, and the case may check validity of a model. Because a decoding problem may be equivalent to a classification problem, a conventional neural network may be tried to classify different inputted error syndromes. A simplest method is to use a fully connected network including an input layer, an intermediate hidden layer, and an output layer. The output layer only includes four homology classes (I, X, Y, and Z) that need to be classified. I represents no error, X represents an X error, Z represents a Z error, and Y represent both the X error and the Z error. A problem lies in that as a length of a surface code that needs to be decoded becomes increasingly large and a quantity of parameters included in the network increases exponentially, difficulty (a required dataset and a convergence time) in training the network also increases exponentially. To cope with this situation, this application proposes a divide-and-conquer idea and adopts a block feature extraction manner. That is, a large surface code is dismantled into small blocks, and "classification" is performed on the small blocks ("classification" herein refers to extracting feature information), classified information (probabilities of classes) is transferred to a previous layer, and then the previous layer determines occurrence probabilities of the error classes in the layer according to the information transferred by the next layer and equivalent error syndromes at the previous layer. This recursion is performed until probabilities of error classes of the entire surface code are finally gathered, and then classification and error correction are performed.

In an exemplary embodiment, the neural network decoder includes m cascaded feature extraction layers, m being a positive integer. The feature extraction layer is a neural network layer for feature extraction. Step 502 may include: performing block feature extraction on the error syndrome information by using the m feature extraction layers, to obtain the feature information. The first feature extraction layer is configured to perform block feature extraction on the error syndrome information, and the $i^{th}$ feature extraction layer is configured to perform block feature extraction on a feature extraction result of a previous feature extraction layer, i being an integer greater than 1 and less than or equal to m.

In some embodiments, the neural network decoder further includes a plurality of cascaded feature fusion layers, and the feature fusion layer is a neural network layer for performing fusion decoding processing on the feature information extracted by the feature extraction layer.

A CNN is used as an example, the feature extraction layer is a convolutional layer, and the feature fusion layer may be a fully connected layer. The neural network decoder includes an input layer, at least one convolutional layer, at least one fully connected layer, and an output layer. There are generally a plurality of convolutional layers, and there are also generally a plurality of fully connected layers. As shown in FIG. 6, error syndrome information 61 is classified into a plurality of data units. In FIG. 6, for example, the error syndrome information is a 4*4 data array and is classified into four data units (different data units are shown with different fillings in FIG. 6), and each data unit is a 2*2 sub-array. The error syndrome information 61 is inputted to a neural network decoder 62. For a convolutional layer of the neural network decoder 62, different data units are simultaneously read by the same convolution kernel in a block feature extraction manner. If C features need to be read, C convolution kernels are required. C is a quantity of channels corresponding to the convolutional layer. For a surface code with a length of L, a length of a sub-array corresponding to each convolution is l, a first layer needs l×l convolution kernels mapped from one channel to $C_1(L)$ channels, a second layer needs l×l convolution kernels mapped from $C_1(L)$ channels to $C_2(L)$ channels, and so on, and a total of approximately log(L/l) layers of convolution are required. The quantity of channels is a hyperparameter that needs to be adjusted and increases with L. Finally, an array with a size of approximately $O(C_{log(L/l)}(L))$ is outputted from the convolutional layer, and the array is inputted to the fully connected layer. If $C_k(L) \sim O(L^2)$ are selected each time the array passes through one fully connected layer, a depth of the fully connected layer is approximately O(log L). In this way, a model with a relatively small depth may be used for a surface code with a very large length. In this way, a depth of the model is asymptotically O(log L). If $C_k(L) \sim O(L^2)$ are selected, a $k^{th}$ layer of convolutional neural network to a $(k+1)^{th}$ layer of convolutional neural network include $O(L^2)$ parameters, and a total quantity of parameters of all convolutional layers is $O(L^4 \log L)$. Similarly, a total quantity of parameters of fully connected layers is also $O(L^1 \log L)$. Different values may be selected for a size of a sub-array during each renormalization. The growth manner is obviously polynomial rather than exponential, that is, the solution is to be extensible.

For example, error syndrome information is an 8*8 data array, the 8*8 data array may be divided into 16 2*2 sub-arrays. A size of a convolution kernel of a first convolutional layer is 2*2, block feature extraction may be performed by using the first convolutional layer, to obtain a 4*4 feature data array, and the 4*4 feature data array may be divided into four 2*2 sub-arrays. A size of a convolution kernel of a second convolutional layer is 2*2, and block feature extraction may be performed by using the second convolutional layer, to obtain a 2*2 feature data array. When the error syndrome information or the feature data array is partitioned, sizes of divided sub-arrays may be the same or may be different. In a case that different qubits cause different error rates, different sizes bring advantages in principle. However, it is relatively easy to operate for training or inferring if the sizes are the same.

In some embodiments, when the feature extraction layer performs block feature extraction, there is no intersection between any two blocks. That is, for each layer of feature extraction, there is no communication between all sub-arrays, and there is no intersection between syndromes in regions on which the convolution kernels act. Only when feature information of the sub-arrays is collected and gathered to the next layer, the information of the sub-arrays is processed and comprehensively used at the same time. Since the feature extraction does not necessarily correspond to a specific qubit error probability, belief propagation does not need to be performed to align a marginal probability, which also simplifies the algorithm and is likely to provide better performance.

Exemplarily, the algorithm is described by using L=15 as an example. There are two layers of convolution in total: A 4*4 convolution kernel may be used for a first layer of convolution, and the convolution kernel is mapped from one channel to 500 channels; and a size of a convolution kernel of a second layer is 2*2, and the convolution kernel is mapped from 500 channels to 1000 channels. In this case, there are 4000 neurons in the second layer. Subsequently, values of the 4000 neurons are classified by using a fully connected network: A first fully connected layer connects 4000 to 1024 neurons: a second fully connected layer connects 1024 to 512 neurons, a third fully connected layer connects 512 to 128 neurons, and a fourth fully connected layer connects 128 to 4 neurons (I, X, Y, and Z). Pytorch code of a specific network model may be as follows:

```
from torch import nn
class CNN_2D(nn.Module):
    def _init_(self, input_size, output_size = 4):
        self.input_size = input_size
        super(CNN_2D, self)._init_( )
        self.conv1 = nn.Conv2D(15, 500, stride = 4, kernel_size = 4, padding = 0)
        self.relu1 = nn.ReLU( )
        self.conv2 = nn.Conv2D(500, 1000, stride = 2, kernel_size = 2, padding = 0)
        self.relu2 = nn.ReLU( )
        self.fc1 = nn.Linear(1000*2*2, 1024)
        self.relu3 = nn.ReLU( )
        self.fc2 = nn.Linear(1024, 512)
        self.relu4 = nn.ReLU( )
        self.fc3 = nn.Linear(512, 128)
        self.relu5 = nn.ReLU( )
        self.fc4 = nn.Linear(128, 4)
    def forward(self, x):
        x = self.conv1(x)
        x = self.relu1(x)
        x = self.conv2(x)
        x = self.relu2(x)
        x = x.view(-1, 1000*2*2)
        x = self.c1(x)
        x = self.relu3(x)
        x = self.fc2(x)
        x = self.relu4(x)
        x = self.fc3(x)
        x = self.relu5(x)
        x = self.fc4(x)
```

As can be seen from the above example, a simple ReLU layer is removed, there are only six layers in the entire neural network, and the neural network is very shallow.

A physical qubit in which an error occurs in the quantum circuit and a corresponding error type may be determined based on the error result information outputted by the neural network decoder. For example, a position of a physical qubit in which an error occurs in the quantum circuit and an error type of the physical qubit in which the error occurs at the position are determined. For example, the error type is an X error, a Z error, or a Y error.

In some embodiments, to reduce complexity of the neural network decoder and further reduce a decoding time, the neural network decoder may use a logic-level output. In this case, the error result information outputted by the neural network decoder includes a logic-level output result, and the logic-level output result refers to a logic error class obtained after an error is specifically mapped.

Figure 7:
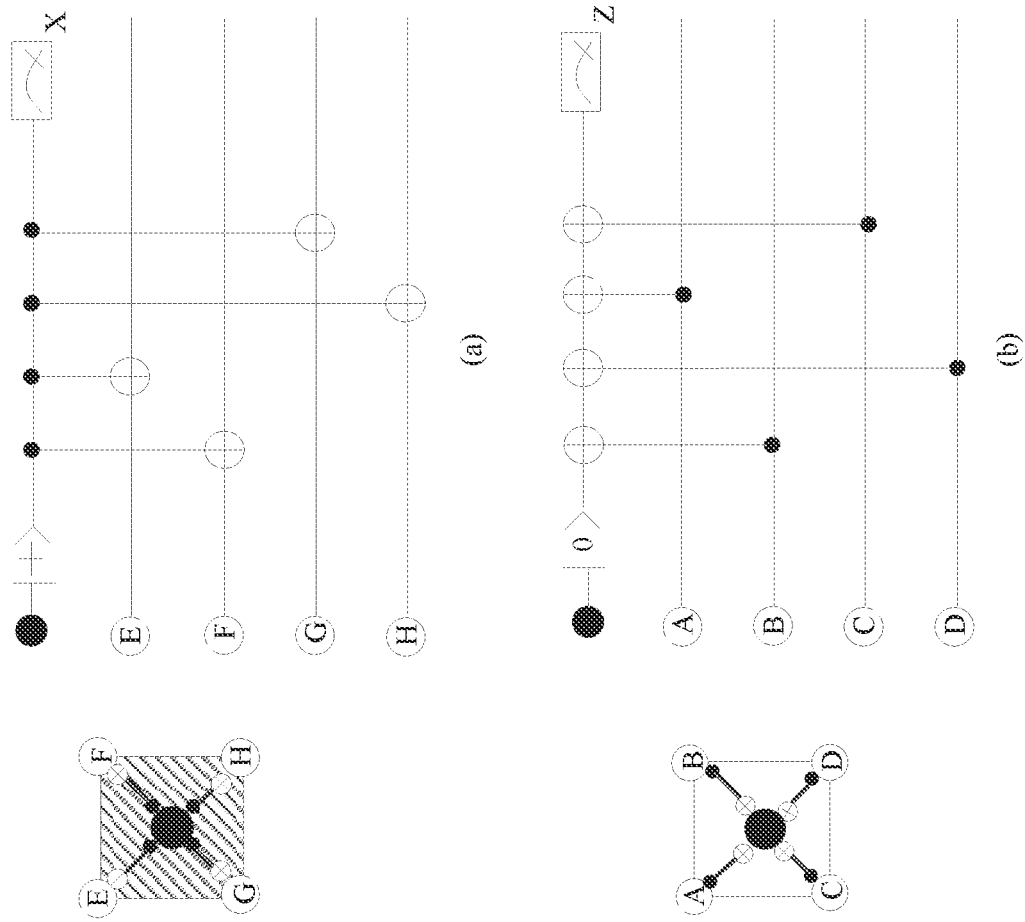
FIG. 7 is a schematic diagram of an eigenvalue measurement circuit according to an embodiment of this application.

In addition, when real-time QEC is performed, measurement (parity check) circuits for two types of stabilizer generators are shown in FIG. 7 in this application. The part (a) in FIG. 7 shows an eigenvalue measurement circuit of a stabilizer generator for detecting a Z error, and the part (b) in FIG. 7 shows an eigenvalue measurement circuit of a stabilizer generator for detecting an X error. In this circuit, an order of action of a controlled NOT (CNOT) gate is very important and cannot be reversed, and otherwise, it causes collision caused by different quantum gates using the same qubit. In this process, all steps, including the CNOT gate, auxiliary state preparation, and final auxiliary state measurement, cause noise. Because the CNOT gate transmits an error, the two types of syndrome measurement on X and Z are embedded with each other. The propagation of the error may be minimized in an arrangement manner shown in FIG. 7, and impact thereof on an error correction capability is ignored. Arrangement in another sequence greatly reduces the error correction capability.

Figure 8:
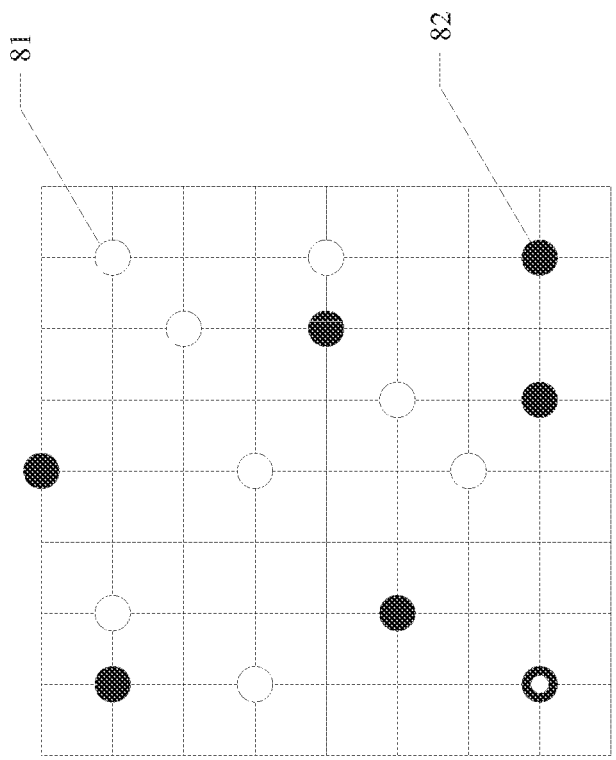
FIG. 8 is a schematic diagram of an error syndrome with noise according to an embodiment of this application.

FIG. 8 is a schematic diagram of an error syndrome of a syndrome measurement circuit (or may be referred to as an eigenvalue measurement circuit or a parity check circuit) with noise. In FIG. 8, a white dot 81 represents an error syndrome with a measurement value of 1 on which measurement is correct, and a black dot 82 represents an error syndrome with a measurement value of 1 on which measurement is incorrect. A black dot with a center of white at the lower left corner represents that 1 is to be measured but 0 is measured. It can be predicted that even if there is only one incorrect syndrome point, and a disastrous result is also brought (this is because that the surface code adopts a simple syndrome measurement circuit, decoding and error correction are performed based on one incorrect syndrome point, resulting in a large quantity of errors, thereby immediately exceeding an error correction capability of an error correction code), so a result of one syndrome measurement cannot be relied on. Correspondingly, a plurality of times of syndrome measurements need to be performed. Theoretically, to ensure the effectiveness of the fault-tolerant error correction, error syndrome information of T=O(L) times of measurements needs to be collected, positions of errors are inferred by using the syndromes together, and error correction is performed.

Figure 9:
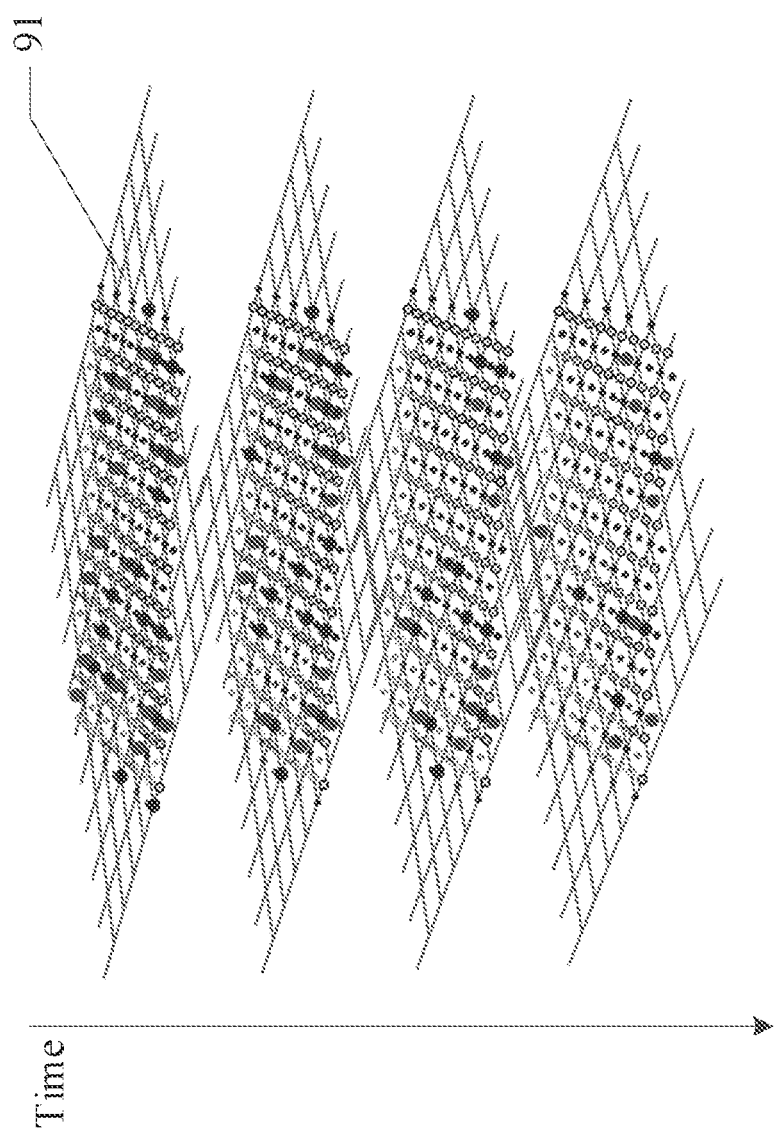
FIG. 9 is a schematic diagram of distribution of a three-dimensional syndrome according to an embodiment of this application.

FIG. 9 is a schematic diagram of three-dimensional syndrome distribution, and a longitudinal direction is a time. This may be considered as a three-dimensional data array formed by 0 and 1. A total of four slices 91 are included in FIG. 9, and each slice 91 represents error syndrome information obtained by one measurement. In each slice 91, some black dots represent that a syndrome eigenvalue of a Z error is measured as 1, and some other black dots represent that a syndrome eigenvalue of an X error is measured as 1, which are not distinguished in FIG. 9.

Figure 10:
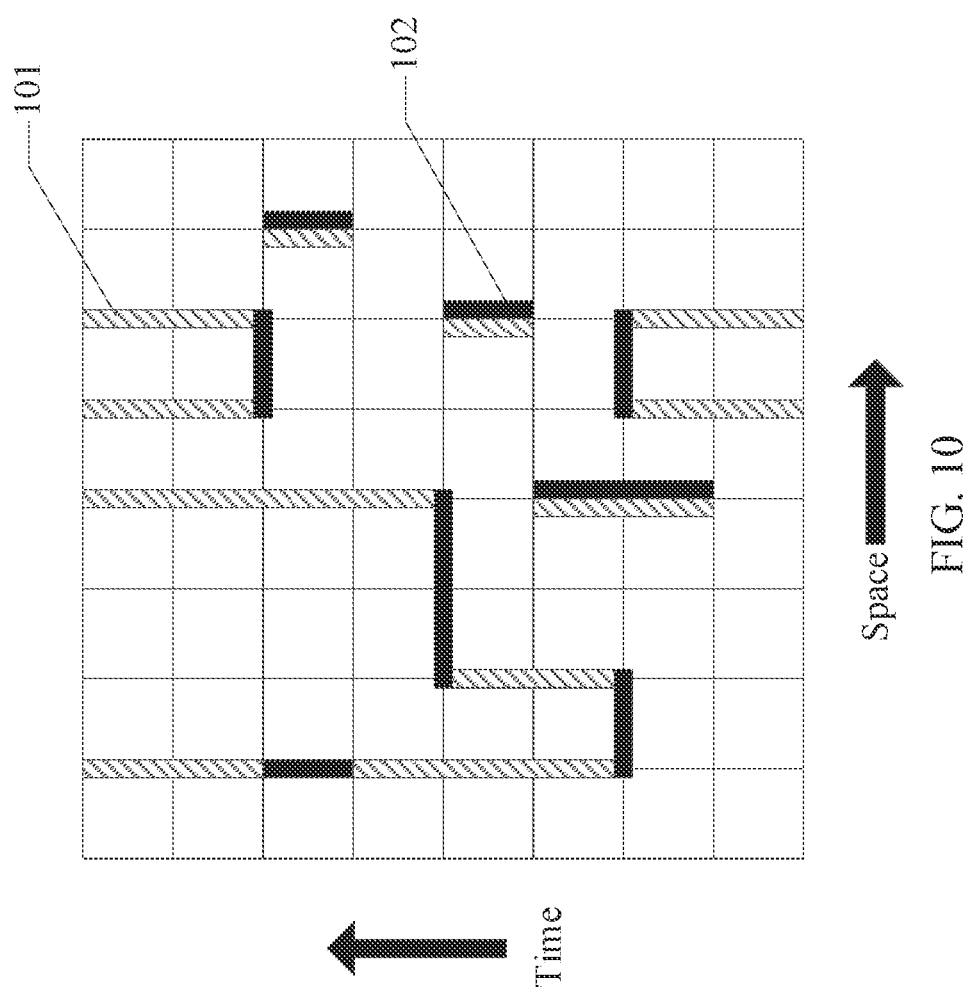
FIG. 10 is a cross-sectional view of spatial-temporal features of noise and a syndrome according to an embodiment of this application.

In addition, noise occurring in the syndrome measurement circuit may be equivalent to random noise occurring on a qubit and noise caused by auxiliary state measurement. In this case, a cross-section of spatial-temporal features of all noise and syndromes is similar to that shown in FIG. 10. In FIG. 10, a line segment filled with slashes 101 represents a syndrome with a value of 1, and a line segment filled with black 102 represents an occurred error; errors in a horizontal direction represent errors occurring on data qubits, and errors in vertical lines represent errors caused by measuring auxiliary qubits; and the two types of errors are combined ("added") to form a closed curve in a three-dimensional space (extending indefinitely in time). In this case, even though noise on a physical qubit is independent, the equivalent noise that occurs on the qubit is weakly correlated. This is because the CNOT gate propagates the noise that occurs on one auxiliary qubit to two data qubits. However, the degree of correlation has limited damage because the noise is within an error correction range of the surface code, but the noise still causes a weak degradation of the error correction performance.

In an exemplary embodiment, to ensure the effectiveness of QEC decoding, obtained error syndrome information includes T data arrays, and each data array is obtained by performing one error syndrome measurement on a target quantum circuit by using a QEC code, T being an integer greater than 1. In some embodiments, as described above, T=O(L).

Figure 11:
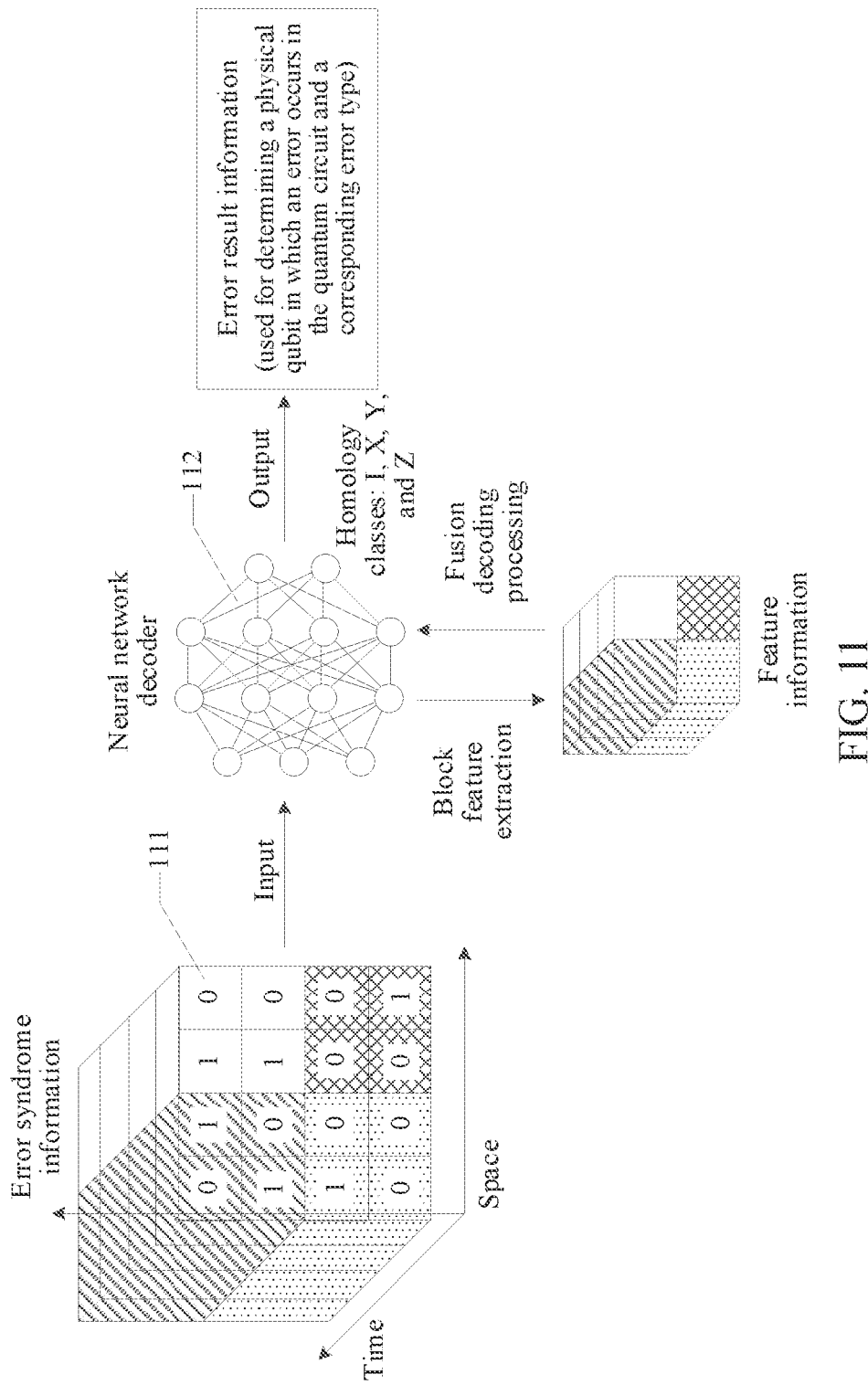
FIG. 11 is a schematic diagram of block feature extraction according to another embodiment of this application.

In this case, after the error syndrome information is obtained, the error syndrome information is classified into at least two data units. One data unit includes T array units at the same position in the T data arrays. A specific neural network algorithm is shown in FIG. 11, a structure of the neural network algorithm is very similar to that in a perfect syndrome case, but also has a difference from that in the perfect syndrome case. As shown in FIG. 11, error syndrome information 111 is classified into a plurality of data units. In FIG. 11, for example, the error syndrome information is a 4*4*4 data array and is classified into four data units (different data units are shown with different fillings in FIG. 11), and each data unit is a 2*2*4 sub-array. The error syndrome information 11 is inputted to a neural network decoder 112. A convolutional layer of the neural network decoder 112 extracts feature information in a block feature extraction manner. During real-time error correction, in addition to classifying homology classes, syndromes also need to be classified. To avoid repetition, only classification on the homology classes is listed herein as an example. First, input channels of a first CNN layer are changed to T layers. Then, a quantity of output channels of each of other CNN layers is increased from $O(L^2)$ to $O(L^3)$. In this case, a final depth of the decoder is still O(log L), and approximately $O(L^6 \log L)$ parameters are required. When a hardware operation algorithm is selected, it is necessary to consider whether there is enough space to store these parameters and parallelize each convolution layer and fully connected layer.

Based on the foregoing, according to the technical solution provided in the embodiments of this application, block feature extraction is performed on error syndrome information of a quantum circuit, to obtain a plurality of groups of feature information, and then fusion decoding processing is further performed on the plurality of groups of feature information, to obtain error result information. Since a block feature extraction manner is used, compared with complete feature extraction on inputted data, on one hand, a quantity of channels of feature information obtained by each feature extraction is reduced, and inputted data of next feature extraction is reduced, which helps to reduce a quantity of feature extraction layers in a neural network decoder, thereby shortening the depth of the neural network decoder. Because the depth of the neural network decoder is shortened, a decoding time used by the neural network decoder is correspondingly reduced. On the other hand, when block feature extraction is performed, parallel feature extraction processing is performed on a plurality of blocks by using a plurality of feature extraction units, that is, the plurality of feature extraction units may synchronously (or referred to as simultaneously) perform feature extraction processing, which helps to reduce the time consumed by feature extraction, thereby reducing the decoding time. Finally, with reference to the two factors, when QEC decoding is performed by using the neural network decoder, the decoding time is fully reduced, thereby meeting the requirements of real-time error correction.

Figure 12:
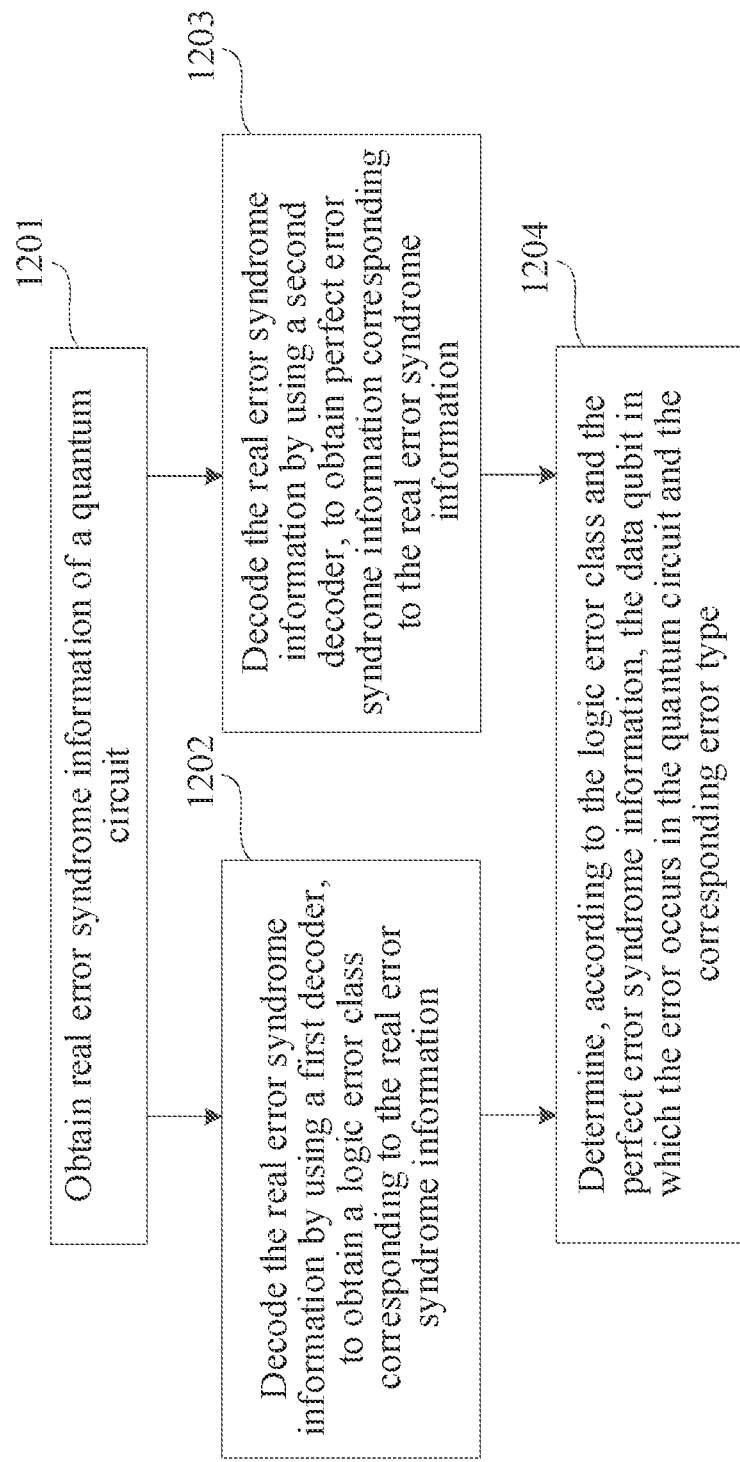
FIG. 12 is a flowchart of a neural network-based quantum error correction decoding method according to another embodiment of this application.

In an exemplary embodiment, the error syndrome information is real error syndrome information obtained by performing error syndrome measurement with noise on a quantum circuit by using a QEC code. To implement fault tolerant and error correction decoding, the neural network decoder includes a first decoder and a second decoder. As shown in FIG. 12, a neural network-based QEC decoding method provided in another embodiment of this application may include the following steps (1201 to 1204).

Step 1201. Obtain real error syndrome information of a quantum circuit.

Because in a real scenario, there is noise when error syndrome measurement is performed on a quantum circuit by using a QEC code, that is, there is a measurement error, the real error syndrome information herein refers to error syndrome information with noise obtained through measurement in the real scenario.

In addition, to ensure the effectiveness of fault tolerant and error correction, the obtained real error syndrome information includes T data arrays, and each data array is obtained by performing error syndrome measurement with noise on the quantum circuit by using the QEC code, T being an integer greater than 1. In some embodiments, as described above, T=O(L), and L is a length of the QEC code. In this case, real error syndrome information obtained by each time of error syndrome measurement may be a (L+1)*(L+1) two-dimensional data array (for ease of machine learning, a syndrome boundary at each moment is appropriately expanded), real error syndrome information obtained by T times of error syndrome measurements may form a (L+1)*(L+1)*T three-dimensional data array.

Step 1202. Decode the real error syndrome information by using a first decoder, to obtain a logic error class corresponding to the real error syndrome information.

The first decoder is configured to decode the real error syndrome information, to obtain a logic error class corresponding to the real error syndrome information. The logic error class is a class obtained after an error occurred in the quantum circuit is mapped. The logic error class may be alternatively referred to as a homology class and includes the following four classes: I, X, Y, and Z. I represents no error, X represents an X error, Z represents a Z error, and Y represent both the X error and the Z error. Each logic error class includes at least one equivalent error element. In some embodiments, each logic error class includes a plurality of equivalent error elements. Elements in the logic error class I are elements in a stabilizer group. Elements in the logic error class X are an element set obtained by multiplying a logic X operator by each element in the stabilizer group. Elements in the logic error class Y are an element set obtained by multiplying a logic Y operator by each element in the stabilizer group. Elements in the logic error class Z are an element set obtained by multiplying a logic Z operator by each element in the stabilizer group. Elements belonging to the same logic error class are equivalent. It is assumed that an actually occurred error E and another error E' belong to the same logic error class, error correction on the error E and error correction on the error E' are equivalent, so that the same effect can be achieved.

In this embodiment of this application, the logic error class corresponding to the real error syndrome information is obtained through prediction by using a trained first decoder. There may be one first decoder, and the first decoder may be a four classification model, and an output of the first decoder includes four logic error classes that need to be classified, that is, I, X, Y, and Z. The first decoder may be a classification model constructed based on a fully connected network, a CNN, an RNN, or another neural network. This is not limited in this embodiment of this application.

In addition, when the first decoder decodes real error syndrome information to obtain a corresponding logic error class, the block feature extraction manner described in the foregoing embodiments may be used. Block feature extraction is performed on the real error syndrome information by using the first decoder, to obtain feature information; and fusion decoding processing is performed on the feature information by using the first decoder, to obtain the logic error class corresponding to the real error syndrome information.

Step 1203. Decode the real error syndrome information by using a second decoder, to obtain perfect error syndrome information corresponding to the real error syndrome information.

Figure 13:
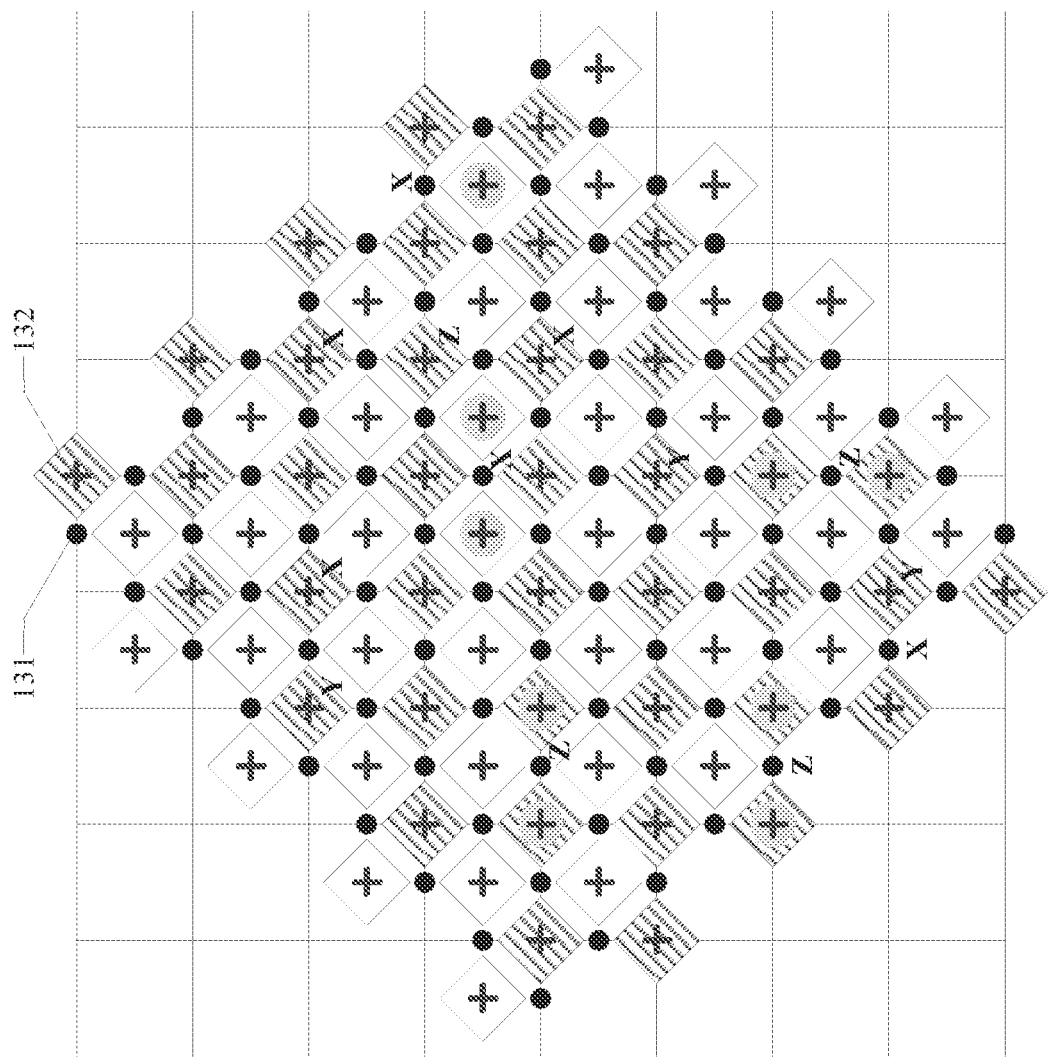
FIG. 13 is a schematic diagram of perfect error syndrome information according to an embodiment of this application.

The second decoder is configured to decode the real error syndrome information, to obtain perfect error syndrome information corresponding to the real error syndrome information. The perfect error syndrome information refers to information obtained by performing error syndrome measurement without noise on the quantum circuit. In this embodiment of this application, real error syndrome information needs to be decoded, to obtain the corresponding perfect error syndrome information in addition to the corresponding logic error class, so that the error result information of the quantum circuit can be finally determined according to the above-described formula 1. Exemplarily, FIG. 13 is a schematic diagram of perfect error syndrome information. In FIG. 13, a black dot 131 represents a data qubit, a cross 132 represents an auxiliary qubit, errors occurring on the auxiliary qubits have no impact on the perfect syndrome measurement, and the errors are marked in the figure by X, Y and Z.

In this embodiment of this application, perfect error syndrome information corresponding to real error syndrome information is obtained by using a trained second decoder. There may be one or more second decoders. In some embodiments, there are k second decoders, k being a positive integer and k being related to a length of a QEC code. It is assumed that the QEC code is a stabilizer code with a length of L, there are $k=L^2-1$ second decoders. In this case, the second decoder may be a binary classification model and an output of the second decoder includes two error syndrome values that need to be classified, that is, 0 and 1, 0 representing no error, and 1 representing an error.

Step 1202 and step 1203 may be performed successively, or may be performed in parallel. When step 1202 and step 1203 are performed in parallel, this helps reduce a time consumed by performing the process. To implement real-time fault tolerant error correction decoding, more devices (for example, FPGA/ASIC) and appropriate communication connection are selected as much as possible to complete parallel execution.

Figure 14:
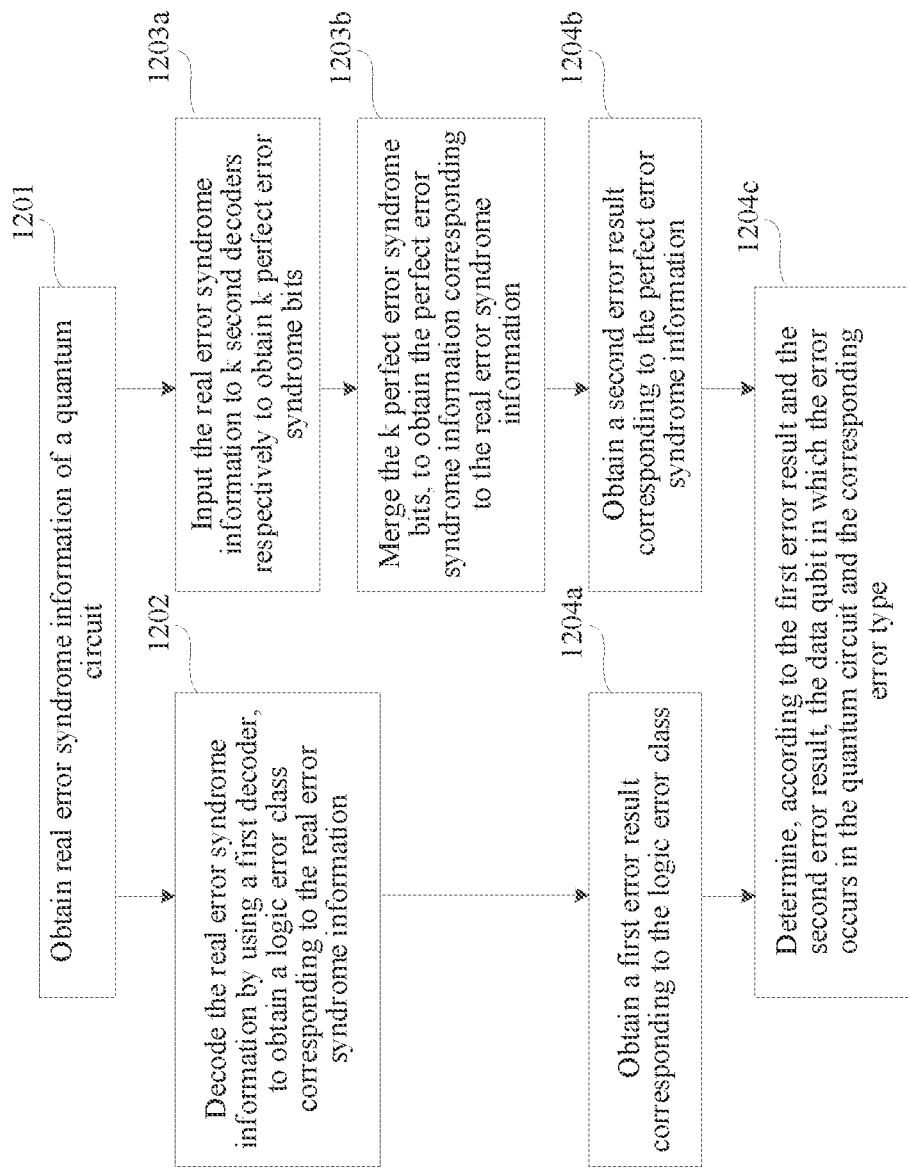
FIG. 14 is a flowchart of a neural network-based quantum error correction decoding method according to another embodiment of this application.

In an exemplary embodiment, there are k second decoders, k being a positive integer and k being related to a length of a quantum error correction code. The k second decoders are configured to respectively decode the real error syndrome information, to obtain k perfect error syndrome bits, the k perfect error syndrome bits being used for performing merging to obtain the perfect error syndrome information. That is, as shown in FIG. 14, step 1203 may be replaced with the following steps.

Step 1203a. Input the real error syndrome information to k second decoders respectively to obtain k perfect error syndrome bits.

Step 1203b. Merge the k perfect error syndrome bits, to obtain the perfect error syndrome information corresponding to the real error syndrome information.

Each second decoder is configured to output a perfect error syndrome bit of one syndrome measurement position, and output results of the k second decoders may be merged to obtain perfect error syndrome bits of all syndrome measurement positions, that is, the perfect error syndrome information corresponding to the real error syndrome information.

Figure 15:
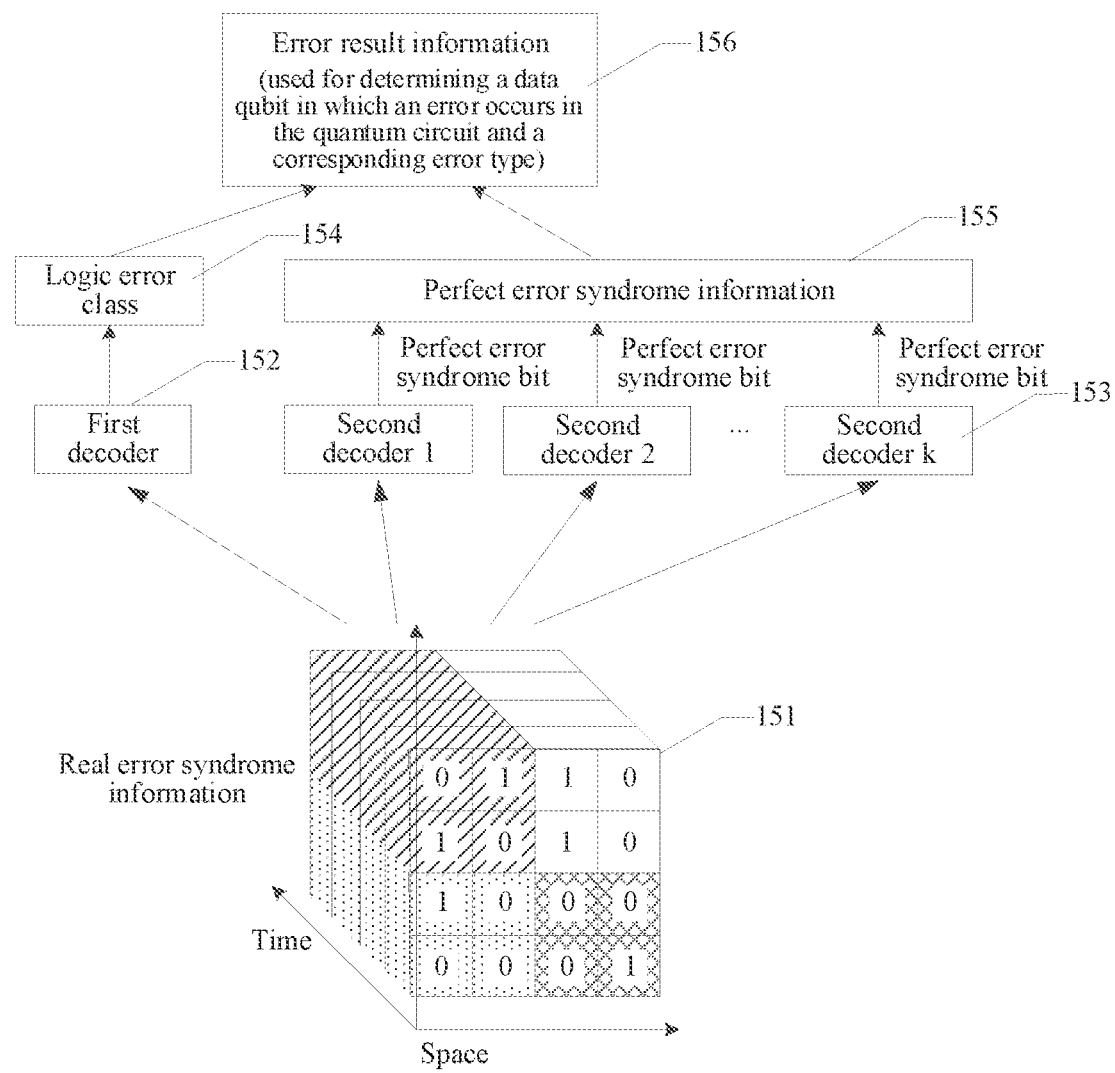
FIG. 15 is a schematic diagram of a fault-tolerant error correction decoding process according to an embodiment of this application.

As shown in FIG. 15, a three-dimensional data array 151 corresponding to real error syndrome information is respectively inputted to a first decoder 152 and second decoders 153, the first decoder 152 outputs a logic error class 154 corresponding to the real error syndrome information, the second decoders 153 output perfect error syndrome bits, the perfect error syndrome bits outputted by the second decoders 153 are merged, to obtain perfect error syndrome information 155 corresponding to the real error syndrome information, and finally, error result information 156 of a quantum circuit is determined according to the logic error class 154 and the perfect error syndrome information 155.

In addition, the second decoder may be a classification model constructed based on a fully connected network, a CNN, an RNN, or another neural network. This is not limited in this embodiment of this application. Model structures of the foregoing decoders (including the first decoder and the second decoders) may be the same or may be different, but model depths are to be as consistent as possible to achieve maximum parallelization.

In addition, when the second decoders decode the real error syndrome information to obtain the corresponding perfect error syndrome information, the block feature extraction manner described in the foregoing embodiments may be used: Block feature extraction is performed on the real error syndrome information by using the second decoders, to obtain feature information; and fusion decoding processing is performed on the feature information by using the second decoders, to obtain perfect error syndrome bits.

Step 1204. Determine, according to the logic error class and the perfect error syndrome information, the data qubit in which the error occurs in the quantum circuit and the corresponding error type.

With reference to formula 1 described above, after a logic error class and perfect error syndrome information are obtained, a corresponding simple error may be determined according to the perfect error syndrome information, and then the simple error may be multiplied by any element in the logic error class, to obtain an error that needs to be corrected, that is, a data qubit in which an error occurs in the quantum circuit and a corresponding error type may be obtained. For example, a position of a data qubit in which an error occurs in the quantum circuit and an error type of the data qubit in which the error occurs at the position are determined. For example, the error type is an X error, a Z error, or a Y error.

In an exemplary embodiment, as shown in FIG. 14, step 1204 may be replaced with the following steps.

Step 1204a. Obtain a first error result corresponding to the logic error class.

Figure 16:
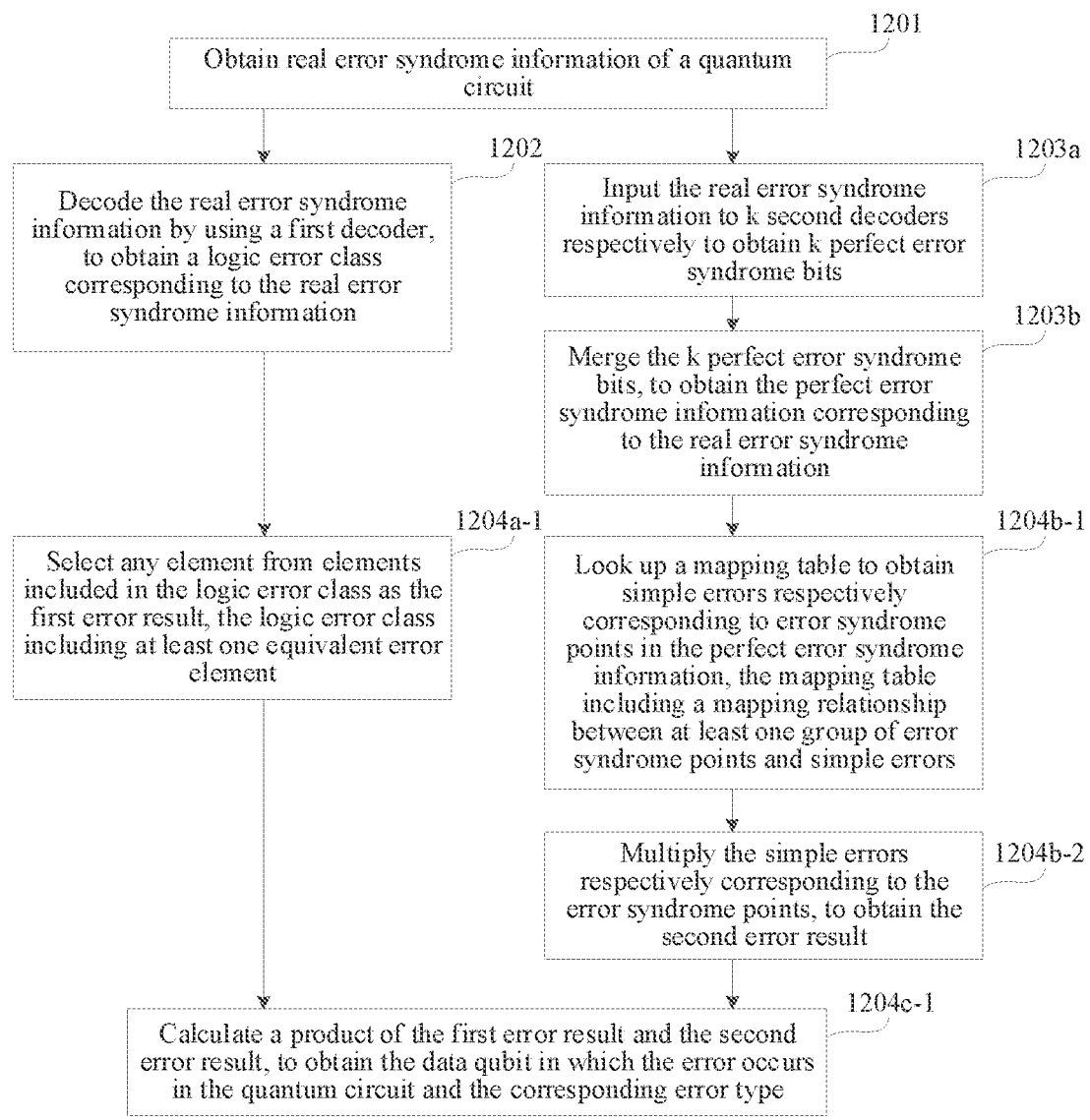
FIG. 16 is a flowchart of a neural network-based quantum error correction decoding method according to another embodiment of this application.

In an exemplary embodiment, as shown in FIG. 16, step 1204a may be replaced with the following step: Step 1204a-1. Select any element from elements included in the logic error class as the first error result, the logic error class including at least one equivalent error element.

For example, if a logic error class corresponding to real error syndrome information obtained through decoding is X, any one element is selected from error elements included in the logic error class X as a first error result.

Step 1204b. Obtain a second error result corresponding to the perfect error syndrome information.

After perfect error syndrome information corresponding to the real error syndrome information is obtained through the decoding, a second error result corresponding to the perfect error syndrome information may be obtained by using a simple decoder.

In an exemplary embodiment, as shown in FIG. 16, step 1204b may be replaced with the following steps: Step 1204b-1. Look up a mapping table to obtain simple errors respectively corresponding to error syndrome points in the perfect error syndrome information, the mapping table including a mapping relationship between at least one group of error syndrome points and simple errors; and step 1204b-2. Multiply the simple errors respectively corresponding to the error syndrome points, to obtain the second error result.

Step 1204c. Determine, according to the first error result and the second error result, the data qubit in which the error occurs in the quantum circuit and the corresponding error type.

In an exemplary embodiment, as shown in FIG. 16, step 1204c may be replaced with the following step: Step 1204c-1. Calculate a product of the first error result and the second error result, to obtain the data qubit in which the error occurs in the quantum circuit and the corresponding error type.

The logic error class is inversely deduced in the foregoing manner to obtain an equivalent error occurring on a data qubit, the deduced error is not necessarily the same as an originally occurred error, but has the same effect (or a difference between the errors is localized) as the originally occurred error, and this is an error degeneracy phenomenon specific to a QEC code.

In addition, step 1204a and step 1204b may be performed successively, or may be performed in parallel. When step 1204a and step 1204b are performed in parallel, this helps reduce a time consumed by performing the process. To implement real-time fault tolerant error correction decoding, more devices (for example, FPGA/ASIC) and appropriate communication connection are selected as much as possible to complete parallel execution.

In some embodiments, after the data qubit in which the error occurs in the quantum circuit and the corresponding error type are determined, the following steps (not shown in FIG. 16) may be further performed.

Step 1205. Generate an error-correction control signal according to the error result information, the error-correction control signal being used for correcting an error generated by the quantum circuit.

Step 1206. Transmit the error-correction control signal to the quantum circuit.

In some embodiments, the error-correction control signal may be a microwave control signal, or may be an electronic control signal, or may be a control signal in another form. This is not limited in this embodiment of this application. The error-correction control signal is transmitted to the quantum circuit, so that the quantum circuit corrects, based on the error-correction control signal, an error that occurs on a data qubit, to implement real-time error correction.

Base on the foregoing, according to the technical solution provided in the embodiments of this application, real error syndrome information of a quantum circuit is decoded, to obtain a corresponding logic error class and perfect error syndrome information, and then a data qubit in which an error occurs in the quantum circuit and a corresponding error type are determined according to the logic error class and the perfect error syndrome information, so that fault tolerant error correction decoding is performed on the error syndrome information by using a neural network algorithm in a case that the error syndrome information of the quantum circuit is not perfect. Moreover, according to the solution, the fault tolerant error correction decoding is equivalent to a classification problem, so that it is suitable for performing the fault tolerant error correction decoding on error syndrome information by using a high-efficiency neural network classifier, thereby improving the speed of the fault tolerant error correction decoding. If an appropriate neural network classifier is selected, the speed of a decoding algorithm can be greatly accelerated, and a road is paved for implementing the real-time fault-tolerant error correction decoding.

The following describes a process of training a neural network decoder.

Labeled training data of the neural network decoder may be generated in a simulation manner, and then the neural network decoder is trained by using the labeled training data in a supervised learning manner.

First, a case of obtaining a perfect error syndrome may be still considered. A possible implementation is to probabilistically generate an error on a physical qubit included in a sample quantum circuit, then obtain error syndrome information and error result information of the sample quantum circuit, and generate training data. For example, an X or Y or Z error is generated on each physical qubit of the sample quantum circuit by using a probability P. Specifically, a standard random number generation method may be adopted to sample a random number that is uniformly distributed in [0, 1]. If the random number falls in [0, p/3], it is set to an X error; if the random number falls in [p/3, 2p/3], it is set to a Y error; if the random number falls in [2p/3, p], it is set to a Z error; and if the random number falls in [p, 1], it is set to I (that is, no error). Therefore, for a surface code with a length of L, a two-dimensional (L+1)*(L+1) array obtained by combining results of two types of parity check is obtained, then a simple error is removed from the simulated error, and an error class (a homology class) to which the array belongs is extracted as a label of the data sample.

However, such a noise model is too ideal. Another possible implementation is to perform quantum process tomography (QPT) on a qubit experimentally, to extract a real noise model. Due to excessively high consumption of QPT resources, the QPT only acts on two qubits at most that are geometrically neighbor. Therefore, it is equivalent to that noise correlation between three or more qubits is ignored. If this correlation is strong, this correlation is to be first removed experimentally because this correlation has a fatal impact on the QEC. After the QPT is completed, the impact of real physical noise on a quantum state may be directly simulated by using a Monte Carlo method according to the QPT, and then ideal party check is performed and a syndrome and an error homology class are extracted to obtain labeled data. The disadvantage of this is that it is impossible to simulate a large-length surface code (for example, a surface code with L>10), because this requires full quantum simulation, and the computational complexity exceeds the capability of the existing most powerful computer.

The training of the neural network decoder follows a standard neural network training manner. In some embodiments, a cross entropy is used as a target function and the target function is trained by using a stochastic gradient descent algorithm. Generally, better performance may be obtained by using an adaptive moment estimation (ADAM) algorithm. Training samples may range from 1 million to 30 million, a learning rate is between 1e-5 and 1e-2, and a learning momentum is between 1e-4 and 1e-6. It is found through experiments that when the hyperparameters are set, a satisfactory training result can be obtained under the pytorch 1.2.

For a case that there is noise interference in obtained error syndrome information, similar to a case of a perfect syndrome, a training data set is also generated in a simulation manner. Meanwhile, a relatively simple manner or a relatively actual manner may be adopted.

If the relatively simple manner is used, a generation process of training data of the neural network decoder is as follows:

1. Probabilistically generate an error on a physical qubit included in a sample quantum circuit. For example, for each data qubit, an X, Y or Z error (memory noise) is generated on each qubit with a probability p before parity check is performed.

2. Probabilistically generate an error on an auxiliary qubit corresponding to the sample quantum circuit, the auxiliary qubit being used for performing measurement to obtain error syndrome information of the sample quantum circuit. For example, for an auxiliary qubit prepared at $|0\rangle$ (or $|+\rangle$), an X or Z error (state preparation noise) is generated with the probability p.

3. Probabilistically generate an error on a CNOT gate included in an eigenvalue measurement circuit corresponding to the sample quantum circuit, the eigenvalue measurement circuit being configured to measure an eigenvalue of a stabilizer generator. For example, for each CNOT gate in the eigenvalue measurement circuit, an error (quantum gate noise) in 15 dual-Pauli operators (including IX, IY, IZ, YI, ZI, XX, XY, XZ, YX, YY, YZ, ZX, ZY, and ZZ) is generated with the probability p.

4. Probabilistically generate a measurement error in a case that error syndrome measurement is performed on the sample quantum circuit by using a QEC code. For example, an X(Z) error (measurement noise) occurs before Z(X) measurement with the probability p, Z(X) representing that only an X error affects Z measurement, and X(Z) representing that only a Z error affects X measurement.

5. Obtain the error syndrome information and error result information of the sample quantum circuit, and generate the training data.

In the manner described above, T rounds of parity check measurements are repeated, and for a surface code with a length of L, results of two types of parity check are combined into a two-dimensional T*(L+1)*(L+1) array formed by 0 and 1, then the simulated results may be processed to obtain errors, and a label of a homology class and a label of a perfect error syndrome required by training are extracted from the two-dimensional syndrome array.

If the relatively actual manner is used, a generation process of training data of the neural network decoder is as follows:

1. Perform QPT on a sample quantum circuit, and extract a noise model of the sample quantum circuit.

2. Simulate an evolution of a quantum state of the sample quantum circuit under the action of noise based on the noise model.

3. Obtain the error syndrome information and error result information of the sample quantum circuit, and generate the training data.

When the relatively actual manner is used, the QPT may be first performed experimentally on the qubit to extract the accurate mathematical description of memory noise, state preparation noise, quantum gate noise, and measurement noise, and then after an evolution of the quantum state under the action of the noise is directly simulated, a syndrome and a label are generated.

The generation process of the training data set of the neural network decoder and the training manner of the neural network decoder are described above, for a first training data generation manner, error simulation is performed by using an ideal noise model to generate training data, which is relatively simple; and for a second training data generation manner, a real noise model is extracted through QPT, and then an impact of real physical noise on a sample quantum circuit is simulated by using the real noise model, to generate training data, which is more practical.

Figure 17:
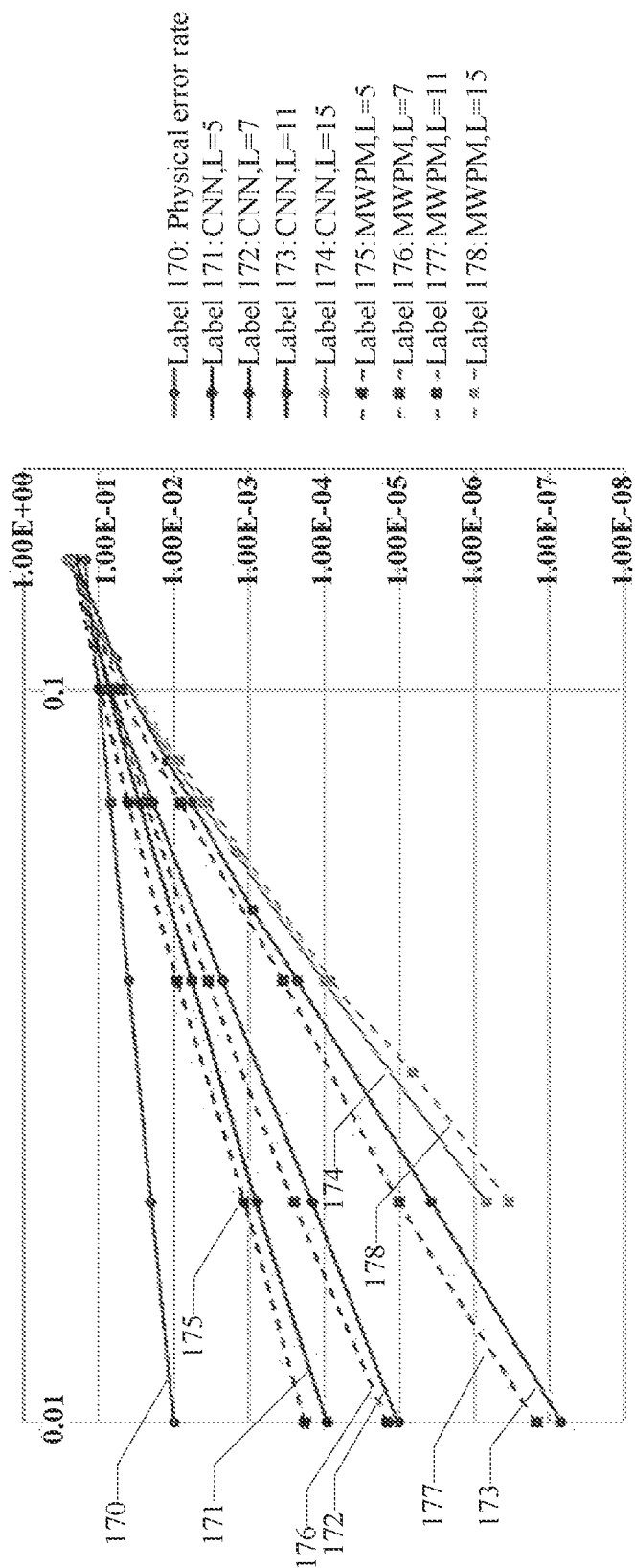
FIG. 17 is a schematic diagram of comparison of simulation results according to an embodiment of this application.

Based on the perfect error syndrome, a numerical simulation is performed on a surface code with a length of L. The numerical simulation method is as follows: X, Y and Z errors are generated randomly on each qubit according to a probability of p, and no error is generated according to (1−p). p herein is a physical error rate. Subsequently, a training set is generated according to p=0.11 or p=0.12 to train a neural network decoder. After the decoder is trained, a large quantity of noise samples are generated for different p by using the same noise model, and then the noise samples are inputted to the neural network decoder and an error class (homology class) result is outputted. The error class result is compared with an error class of real noise, it is determined whether the decoding is correct, and then a frequency (probability) of the decoding error is recorded as a logic bit error rate. Meanwhile, simulation is also performed by using the MWPM to compare the performance of the decoders. Specific simulation results are shown in FIG. 17.

Herein, it can be clearly seen that, for small-length surface codes (L=5, L=7, L=11), the neural network decoder provided in this application is simple, but better than the MWPM in each interval of an error rate. For L=15, the decoding performance of the neural network decoder is slightly poor than that of the MWPM, because only a network model and a quantity of samples that are the same as that when L=11 are used (up to the upper limit of 32 GB of a stand-alone memory used during test after being loaded). Obviously, for L=15, a network is trained by using approximately 30 million or more samples. In addition, a threshold of the simple neural network decoder also reaches 15% and exceeds a threshold of the MWPM, which approaches a limit theoretically.

The neural network parameters corresponding to surface codes with different lengths are listed in Table 1:

TABLE 1

Neural network parameters corresponding to surface codes with difference lengths

| L | Parameter space | Size of a training set | Size of a training file (uncompressed) | Model parameter | Network depth | Execution time |
|---|---|---|---|---|---|---|
| 5 | $2^{36}$ | 1 million | ~50 MB | ~1.1 million | 4 | ~100 ns |
| 7 | $2^{64}$ | 2 million | ~250 MB | ~1.1 million | 4 | ~100 ns |
| 11 | $2^{144}$ | 20 million | ~3.2 GB | ~4.76 million | 5 | ~200 ns |
| 15 | $2^{256}$ | 20 million | ~7 GB | ~5 million | 5 | ~200 ns |

It can be seen that the network depth changes slowly with L, and the actual execution time does not increase rapidly. The network parameters and the required training data set do not increase with L exponentially. On the contrary, the network parameters and the required training data set increase in a polynomial, and the increasing speed is not very fast. This means that the algorithm is scalable in principle. However, a large quantity of times are still required to generate a training set of a large-length surface code (this process is parallelizable), and a lot of internal memory and GPU computational resources are still consumed in training a model (especially for L≥15, an internal memory greater than 128 GB and two blocks of nVidia V100 of GPUs are required), so that training can be completed within an acceptable time length to reach an expected decoding performance indicator. However, on one hand, these hardware resources are not expensive under existing conditions, and on the other hand, once the effectiveness of the algorithm is indeed verified on an experimental system, the investment in these additional resources is worthwhile because the training process is one-time.

The effective execution time in Table 1 is a maximum value (approximately 5000) that can be reached by a total operation time/a total quantity of times of decoding after thousands of times of decoding are inputted to one GPU (which is based on nVidia GTX 2070 herein) at the same time. This time can only be a necessary reference requirement (if this value is excessively high, the algorithm inevitably cannot obtain a quite low delay) and is not equivalent to the computation time of real-time decoding of the GPU.

During design of a model, $C_k \sim O(L^2)$ is selected, but is not necessary. Alternatively, another polynomial progressive increasing manner may be selected without much impacts on the network depth. The technical solution provided by this application is not only applicable to the surface code, but also applicable to a fault-tolerant QEC solution of another basic topological code such as a color code. A batch-normalization-like layer may be introduced before an excitation layer, and different target functions may be used, or different learning strategies such as Adam may be used. According to the solution provided in the foregoing embodiments, the convolution layer for fault-tolerant error correction is reformed only in space, and the effects of error correction can be compared by reforming in three directions. The solution mainly uses labeled training data generated through simulation. In an actual experiment, it is also possible to obtain a homology class corresponding to an error by directly measuring experimental data.

The following is an apparatus embodiment of this application, which can be configured to execute the method embodiments of this application. For details not disclosed in the apparatus embodiments of this application, refer to the method embodiments of this application.

Figure 18:
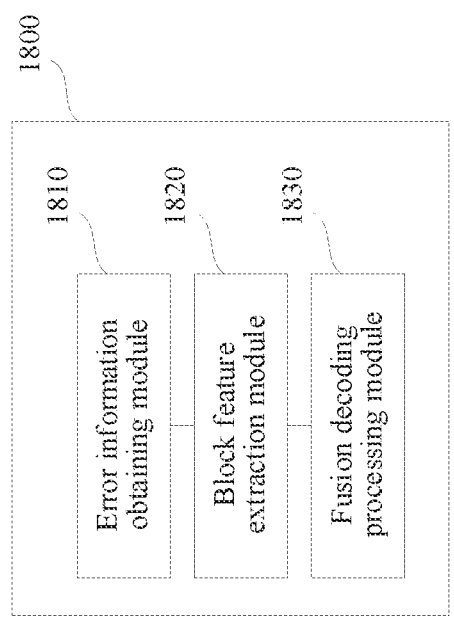
FIG. 18 is a block diagram of a neural network-based quantum error correction decoding apparatus according to an embodiment of this application.

FIG. 18 is a block diagram of a neural network-based quantum error correction decoding apparatus according to an embodiment of this application. The apparatus has functions of implementing the foregoing method embodiments. The functions may be implemented by hardware, or may be implemented by hardware executing corresponding software. The apparatus may be a computer device or may be disposed in a computer device. An apparatus 1800 may include: a syndrome information obtaining module 1810, a block feature extraction module 1820, and a fusion decoding processing module 1830.

The syndrome information obtaining module 1810 is configured to obtain error syndrome information of a quantum circuit, the error syndrome information being a data array formed by eigenvalues of a stabilizer generator of a QEC code.

The block feature extraction module 1820 is configured to perform block feature extraction on the error syndrome information by using a neural network decoder, to obtain feature information, a feature extraction layer of the neural network decoder being configured to perform block feature extraction on inputted data, the block feature extraction referring to that after the inputted data is partitioned into at least two blocks, parallel feature extraction processing is performed on the at least two blocks by using at least two feature extraction units.

The fusion decoding processing module 1830 is configured to perform fusion decoding processing on the feature information by using the neural network decoder, to obtain error result information, the error result information being used for determining a data qubit in which an error occurs in the quantum circuit and a corresponding error type.

In an exemplary embodiment, the neural network decoder includes m cascaded feature extraction layers, m being a positive integer.

The block feature extraction module 1820 is configured to perform block feature extraction on the error syndrome information by using the m feature extraction layers, to obtain the feature information.

The first feature extraction layer is configured to perform block feature extraction on the error syndrome information, and the $i^{th}$ feature extraction layer is configured to perform block feature extraction on a feature extraction result of a previous feature extraction layer, i being an integer greater than 1 and less than or equal to m.

In an exemplary embodiment, when the feature extraction layer performs block feature extraction, there is no intersection between any two blocks.

Figure 19:
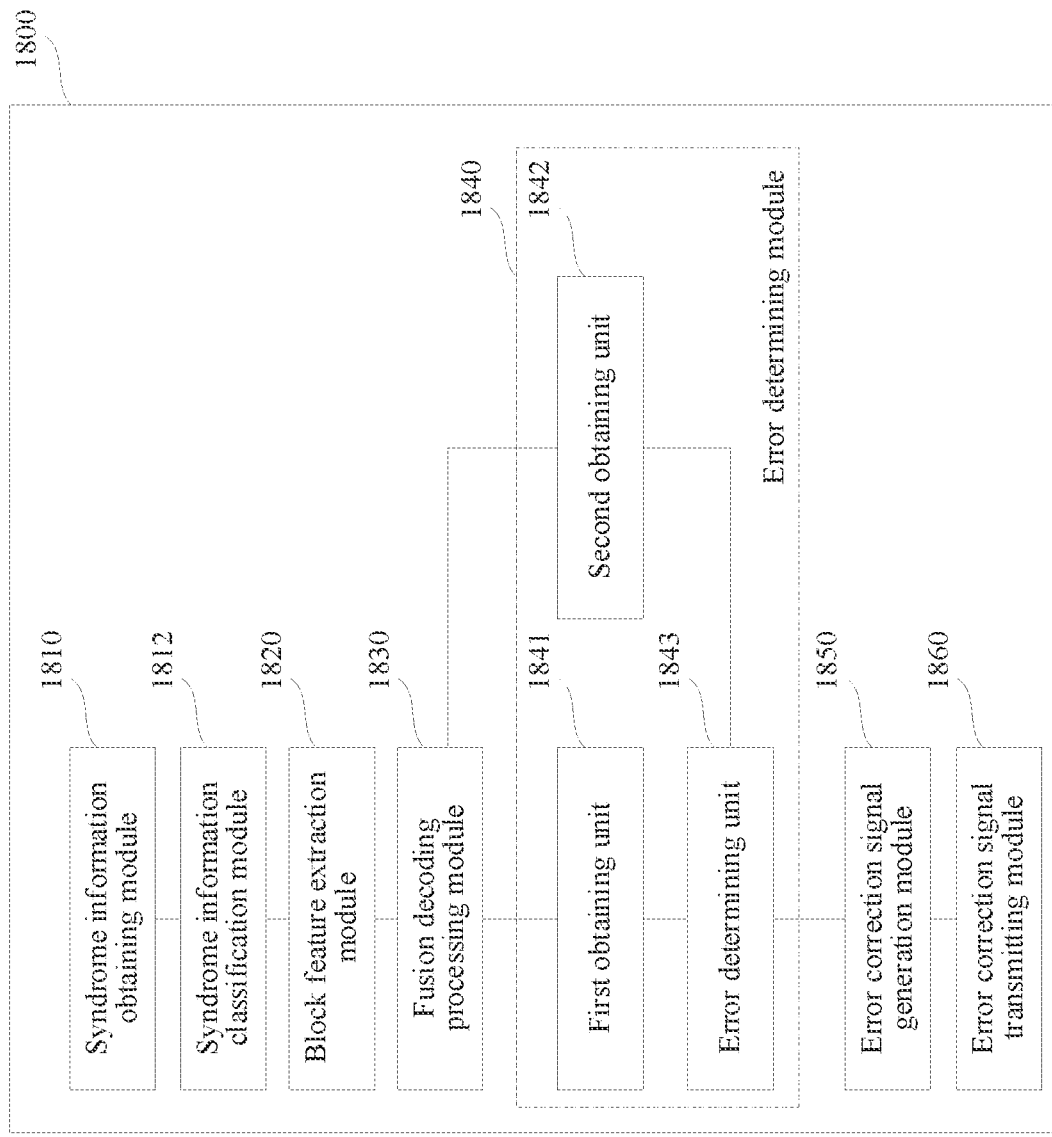
FIG. 19 is a block diagram of a neural network-based quantum error correction decoding apparatus according to another embodiment of this application.

In an exemplary embodiment, the error syndrome information includes T data arrays, and each data array is obtained by performing one error syndrome measurement on the quantum circuit by using the QEC code. T being an integer greater than 1. As shown in FIG. 19, the apparatus 1800 further includes: a syndrome information classification module 1812, configured to classify the error syndrome information into at least two data units. One data unit includes T array units at the same position in the T data arrays.

In an exemplary embodiment, the error syndrome information is real error syndrome information obtained by performing error syndrome measurement with noise on the quantum circuit by using the QEC code: and the neural network decoder includes a first decoder and a second decoder.

The first decoder is configured to decode the real error syndrome information, to obtain a logic error class corresponding to the real error syndrome information, the logic error class being a class obtained after an error occurred in the quantum circuit is mapped.

The second decoder is configured to decode the real error syndrome information, to obtain perfect error syndrome information corresponding to the real error syndrome information, the perfect error syndrome information being information obtained by performing error syndrome measurement without noise on the quantum circuit.

As shown in FIG. 19, the apparatus 1800 further includes: an error determining module 1840, configured to determine, according to the logic error class and the perfect error syndrome information, the data qubit in which the error occurs in the quantum circuit and the corresponding error type.

In an exemplary embodiment, as shown in FIG. 19, the error determining module 1840 includes:

a first obtaining unit 1841, configured to obtain a first error result corresponding to the logic error class;

a second obtaining unit 1842, configured to obtain a second error result corresponding to the perfect error syndrome information: and an error determining unit 1843, configured to determine, according to the first error result and the second error result, the data qubit in which the error occurs in the quantum circuit and the corresponding error type.

In an exemplary embodiment, the first obtaining unit 1841 is configured to select any element from elements included in the logic error class as the first error result, the logic error class including at least one equivalent error element.

In an exemplary embodiment, the second obtaining unit 1842 is configured to look up a mapping table to obtain simple errors respectively corresponding to error syndrome points in the perfect error syndrome information, the mapping table including a mapping relationship between at least one group of error syndrome points and simple errors; and multiply the simple errors respectively corresponding to the error syndrome points, to obtain the second error result.

In an exemplary embodiment, the error determining unit 1843 is configured to calculate a product of the first error result and the second error result, to obtain the data qubit in which the error occurs in the quantum circuit and the corresponding error type.

In an exemplary embodiment, there are k second decoders, k being a positive integer and k being related to a length of a QEC code. The k second decoders are configured to respectively decode the real error syndrome information, to obtain k perfect error syndrome bits, the k perfect error syndrome bits being used for performing merging to obtain the perfect error syndrome information.

In an exemplary embodiment, a generation process of training data of the neural network decoder is as follows:

probabilistically generating an error on a physical qubit comprised in a sample quantum circuit:

probabilistically generating an error on an auxiliary qubit corresponding to the sample quantum circuit, the auxiliary qubit being used for performing measurement to obtain error syndrome information of the sample quantum circuit:

probabilistically generating an error on a controlled NOT gate comprised in an eigenvalue measurement circuit corresponding to the sample quantum circuit, the eigenvalue measurement circuit being configured to measure an eigenvalue of a stabilizer generator;

probabilistically generating a measurement error in a case that error syndrome measurement is performed on the sample quantum circuit by using a QEC code; and obtaining the error syndrome information and error result information of the sample quantum circuit, and generating the training data.

In an exemplary embodiment, a generation process of training data of the neural network decoder is as follows:

performing QPT on a sample quantum circuit, and extracting a noise model of the sample quantum circuit:

simulating an evolution of a quantum state of the sample quantum circuit under the action of noise based on the noise model: and obtaining the error syndrome information and error result information of the sample quantum circuit, and generating the training data.

In an exemplary embodiment, as shown in FIG. 19, the apparatus 1800 further includes: an error correction signal generation module 1850 and an error correction signal transmitting module 1860.

The error correction signal generation module 1850 is configured to generate an error-correction control signal according to the error result information, the error-correction control signal being used for correcting an error generated by the quantum circuit.

The error correction signal transmitting module 1860 is configured to transmit the error-correction control signal to the quantum circuit.

In this application, the term "unit" or "module" refers to a computer program or part of the computer program that has a predefined function and works together with other related parts to achieve a predefined goal and may be all or partially implemented by using software, hardware (e.g., processing circuitry and/or memory configured to perform the predefined functions), or a combination thereof. Each unit or module can be implemented using one or more processors (or processors and memory). Likewise, a processor (or processors and memory) can be used to implement one or more modules or units. Moreover, each module or unit can be part of an overall module that includes the functionalities of the module or unit.

Based on the foregoing, according to the technical solution provided in the embodiments of this application, block feature extraction is performed on error syndrome information of a quantum circuit, to obtain a plurality of groups of feature information, and then fusion decoding processing is further performed on the plurality of groups of feature information, to obtain error result information. Since a block feature extraction manner is used, compared with complete feature extraction on inputted data, on one hand, a quantity of channels of feature information obtained by each feature extraction is reduced, and inputted data of next feature extraction is reduced, which helps to reduce a quantity of feature extraction layers in a neural network decoder, thereby shortening the depth of the neural network decoder. Because the depth of the neural network decoder is shortened, a decoding time used by the neural network decoder is correspondingly reduced. On the other hand, when block feature extraction is performed, parallel feature extraction processing is performed on a plurality of blocks by using a plurality of feature extraction units, that is, the plurality of feature extraction units may synchronously (or referred to as simultaneously) perform feature extraction processing, which helps to reduce the time consumed by feature extraction, thereby reducing the decoding time. Finally, with reference to the two factors, when QEC decoding is performed by using the neural network decoder, the decoding time is fully reduced, thereby meeting the requirements of real-time error correction.

When the apparatus provided in the foregoing embodiments implements functions of the apparatus, the division of the foregoing functional modules is merely an example for description. In the practical application, the functions may be assigned to and completed by different functional modules according to the requirements, that is, the internal structure of the device is divided into different functional modules, to implement all or some of the functions described above. In addition, the apparatus and method embodiments provided in the foregoing embodiments belong to the same concept. For the specific implementation process, reference may be made to the method embodiments, and details are not described herein again.

Figure 20:
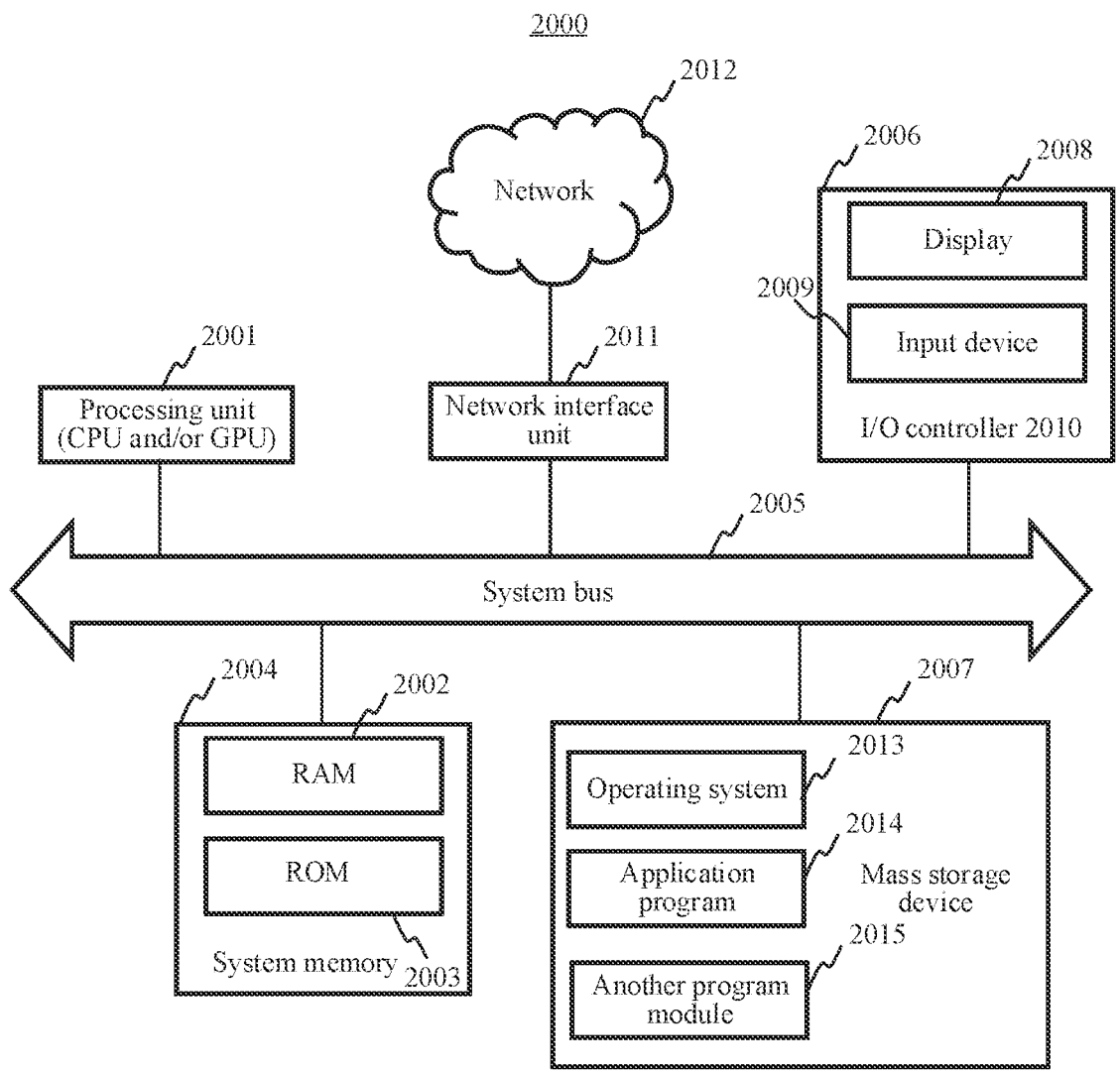
FIG. 20 is a schematic structural diagram of a computer device according to an embodiment of this application.

FIG. 20 is a schematic structural diagram of a computer device according to an embodiment of this application. For example, the computer device may be the control device 33 in the application scenario of the solution shown in FIG. 3. The computer device may be configured to implement the neural network-based quantum error correction decoding method provided in the foregoing embodiments. For example, the computer device is a classic computer. Details are as follows:

The computer device 2000 includes a processing unit 2001 (for example, including a CPU and/or a GPU), a system memory 2004 including a random access memory (RAM) 2002 and a read-only memory (ROM) 2003, and a system bus 2005 connecting the system memory 2004 and the processing unit 2001. The computer device 2000 further includes a basic input/output system (I/O system) 2006 configured to transmit information between components in the computer, and a mass storage device 2007 configured to store an operating system 2013, an application program 2014, and another program module 2015.

The basic I/O system 2006 includes a display 2008 configured to display information and an input device 2009 such as a mouse or a keyboard that is configured to input information by a user. The display 2008 and the input device 2009 are both connected to the processing unit 2001 by an input/output controller 2010 connected to the system bus 2005. The basic I/O system 2006 may further include the input/output controller 2010, to receive and process inputs from multiple other devices, such as a keyboard, a mouse, or an electronic stylus. Similarly, the I/O controller 2010 further provides an output to a display screen, a printer, or another type of output device.

The mass storage device 2007 is connected to the processing unit 2001 by a mass storage controller (not shown) connected to the system bus 2005. The mass storage device 2007 and an associated computer-readable medium provide non-volatile storage for the computer device 2000. That is, the mass storage device 2007 may include a computer-readable medium (not shown) such as a hard disk or a compact disc ROM (CD-ROM) drive.

In general, the computer-readable medium may include a computer storage medium and a communication medium. The computer-storage medium includes volatile and non-volatile media, and removable and non-removable media implemented by using any method or technology used for storing information such as computer-readable instructions, data structures, program modules, or other data. The computer storage medium includes a RAM, a ROM, an erasable programmable ROM (EPROM), an electrically erasable programmable ROM (EEPROM), a flash memory or another solid-state memory technology, a CD-ROM, a digital versatile disc (DVD) or another optical memory, a tape cartridge, a magnetic cassette, a magnetic disk memory, or another magnetic storage device. Certainly, it is known to a person skilled in the art that the computer storage medium is not limited to the foregoing types. The system memory 2004 and the mass storage device 2007 may be collectively referred to as a memory.

According to the various embodiments of this application, the computer device 2000 may further be connected, through a network such as the Internet, to a remote computer on the network for running. That is, the computer device 2000 may be connected to a network 2012 by using a network interface unit 2011 connected to the system bus 2005, or may be connected to another type of network or a remote computer system (not shown) by using a network interface unit 2011.

The memory stores at least one instruction, at least one section of program, a code set or an instruction set, and the at least one instruction, the at least one section of program, the code set or the instruction set is configured to be executed by one or more processors to implement the neural network-based QEC decoding method provided in the foregoing embodiments.

In an exemplary embodiment, a computer-readable storage medium is further provided, the storage medium storing at least one instruction, at least one program, a code set or an instruction set, the at least one instruction, the at least one program, the code set or the instruction set being executed by a processor of a computer device to implement the neural network-based QEC decoding method provided in the foregoing embodiments. In an exemplary embodiment, the computer-readable storage medium may be a ROM, a RAM, a CD-ROM, a magnetic tape, a floppy disk, an optical data storage device, or the like.

In an exemplary embodiment, a computer program product is further provided, and when being executed, the computer program product is configured to implement the neural network-based QEC decoding method provided in the foregoing embodiments.

In an exemplary embodiment, a chip is further provided, including a programmable logic circuit and/or a program instruction, when running on a computer device, the chip being configured to implement the neural network-based QEC decoding method provided in the foregoing embodiments.

In some embodiments, the chip is an FPGA chip or an ASIC chip.

It is to be understood that "plurality of" mentioned in this specification means two or more. "And/or" describes an association relationship for associated objects and represents that three relationships may exist. For example, A and/or B may represent the following three cases: only A exists, both A and B exist, and only B exists. The character "/" generally indicates an "or" relationship between the associated objects. In addition, the step numbers described in this specification merely exemplarily show a possible execution sequence of the steps. In some other embodiments, the steps may not be performed according to the number sequence. For example, two steps with different numbers may be performed simultaneously, or two steps with different numbers may be performed according to a sequence contrary to the sequence shown in the figure. This is not limited in the embodiments of this application.

The foregoing descriptions are merely exemplary embodiments of this application, but are not intended to limit this application. Any modification, equivalent replacement, or improvement made within the spirit and principle of this application shall fall within the protection scope of this application.

What is claimed is:

1. A neural network-based quantum error correction decoding method performed at a computer device, the method comprising:
obtaining error syndrome information of a quantum circuit, the error syndrome information being a data array formed by eigenvalues of a stabilizer generator of a quantum error correction code;
performing block feature extraction on the error syndrome information by using a neural network decoder, to obtain feature information, a feature extraction layer of the neural network decoder being configured to perform the block feature extraction on inputted data, the block feature extraction being configured to, after the inputted data is partitioned into at least two blocks, perform parallel feature extraction on the at least two blocks by using at least two feature extraction units; and
performing fusion decoding processing on the feature information by using the neural network decoder, to obtain error result information, the error result information being used for determining a data qubit in which an error occurs in the quantum circuit and a corresponding error type.

2. The method according to claim 1, wherein the neural network decoder comprises m cascaded feature extraction layers, m being a positive integer; and the performing block feature extraction on the error syndrome information by using a neural network decoder, to obtain feature information comprises:
performing block feature extraction on the error syndrome information by using the m feature extraction layers, to obtain the feature information,
the first feature extraction layer being configured to perform block feature extraction on the error syndrome information, the $i^{th}$ feature extraction layer being configured to perform block feature extraction on a feature extraction result of a previous feature extraction layer, i being an integer greater than 1 and less than or equal to m.

3. The method according to claim 1, wherein the error syndrome information comprises T data arrays, and each data array is obtained by performing one error syndrome measurement on the quantum circuit by using the quantum error correction code, T being an integer greater than 1; and
after the obtaining error syndrome information of a quantum circuit, the method further comprises:
classifying the error syndrome information into at least two data units,
one data unit comprising T array units at a same position in the T data arrays.

4. The method according to claim 1, wherein the error syndrome information is real error syndrome information obtained by performing error syndrome measurement with noise on the quantum circuit by using the quantum error correction code; and the neural network decoder comprises a first decoder and a second decoder;
the first decoder is configured to decode the real error syndrome information, to obtain a logic error class corresponding to the real error syndrome information, the logic error class being a class obtained after an error occurred in the quantum circuit is mapped;
the second decoder is configured to decode the real error syndrome information, to obtain perfect error syndrome information corresponding to the real error syndrome information, the perfect error syndrome information being information obtained by performing error syndrome measurement without noise on the quantum circuit; and
after the performing fusion decoding processing on the feature information by using the neural network decoder, to obtain error result information, the method further comprises:
determining, according to the logic error class and the perfect error syndrome information, the data qubit in which the error occurs in the quantum circuit and the corresponding error type.

5. The method according to claim 4, wherein the determining, according to the logic error class and the perfect error syndrome information, the data qubit in which the error occurs in the quantum circuit and the corresponding error type comprises:
obtaining a first error result corresponding to the logic error class;
obtaining a second error result corresponding to the perfect error syndrome information; and
determining, according to the first error result and the second error result, the data qubit in which the error occurs in the quantum circuit and the corresponding error type.

6. The method according to claim 4, wherein the obtaining a first error result corresponding to the logic error class comprises:
  selecting any element from elements comprised in the logic error class as the first error result,
  the logic error class comprising at least one equivalent error element.

7. The method according to claim 4, wherein the obtaining a second error result corresponding to the perfect error syndrome information comprises:
  looking up a mapping table to obtain simple errors respectively corresponding to error syndrome points in the perfect error syndrome information, the mapping table comprising a mapping relationship between at least one group of error syndrome points and simple errors; and
  multiplying the simple errors respectively corresponding to the error syndrome points, to obtain the second error result.

8. The method according to claim 4, wherein the determining, according to the first error result and the second error result, the data qubit in which the error occurs in the quantum circuit and the corresponding error type comprises:
  calculating a product of the first error result and the second error result, to obtain the data qubit in which the error occurs in the quantum circuit and the corresponding error type.

9. The method according to claim 4, wherein there are k second decoders, k being a positive integer and k being related to a length of the quantum error correction code;
  the k second decoders are configured to respectively decode the real error syndrome information, to obtain k perfect error syndrome bits; and
  the k perfect error syndrome bits are used for performing merging to obtain the perfect error syndrome information.

10. The method according to claim 1, wherein training data of the neural network decoder is generated by:
  probabilistically generating an error on a physical qubit comprised in a sample quantum circuit;
  probabilistically generating an error on an auxiliary qubit corresponding to the sample quantum circuit, the auxiliary qubit being used for performing measurement to obtain error syndrome information of the sample quantum circuit;
  probabilistically generating an error on a controlled NOT gate comprised in an eigenvalue measurement circuit corresponding to the sample quantum circuit, the eigenvalue measurement circuit being configured to measure an eigenvalue of a stabilizer generator;
  probabilistically generating a measurement error in a case that error syndrome measurement is performed on the sample quantum circuit by using a quantum error correction code; and
  obtaining the error syndrome information and error result information of the sample quantum circuit, and generating the training data.

11. The method according to claim 1, wherein training data of the neural network decoder is generated by:
  performing quantum process tomography on a sample quantum circuit, and extracting a noise model of the sample quantum circuit;
  simulating an evolution of a quantum state of the sample quantum circuit under the action of noise based on the noise model; and
  obtaining the error syndrome information and error result information of the sample quantum circuit, and generating the training data.

12. The method according to claim 1, further comprising:
  generating an error-correction control signal according to the error result information, the error-correction control signal being used for correcting an error generated by the quantum circuit; and
  transmitting the error-correction control signal to the quantum circuit.

13. A computer device, comprising a processor and a memory, the memory storing one or more instructions, the one or more instructions being loaded and executed by the processor to perform a plurality of operations including:
  obtaining error syndrome information of a quantum circuit, the error syndrome information being a data array formed by eigenvalues of a stabilizer generator of a quantum error correction code;
  performing block feature extraction on the error syndrome information by using a neural network decoder, to obtain feature information, a feature extraction layer of the neural network decoder being configured to perform the block feature extraction on inputted data, the block feature extraction being configured to, after the inputted data is partitioned into at least two blocks, perform parallel feature extraction on the at least two blocks by using at least two feature extraction units; and
  performing fusion decoding processing on the feature information by using the neural network decoder, to obtain error result information, the error result information being used for determining a data qubit in which an error occurs in the quantum circuit and a corresponding error type.

14. The computer device according to claim 13, wherein the neural network decoder comprises m cascaded feature extraction layers, m being a positive integer; and
  the performing block feature extraction on the error syndrome information by using a neural network decoder, to obtain feature information comprises:
  performing block feature extraction on the error syndrome information by using the m feature extraction layers, to obtain the feature information,
  the first feature extraction layer being configured to perform block feature extraction on the error syndrome information, the $i^{th}$ feature extraction layer being configured to perform block feature extraction on a feature extraction result of a previous feature extraction layer, i being an integer greater than 1 and less than or equal to m.

15. The computer device according to claim 13, wherein the error syndrome information comprises T data arrays, and each data array is obtained by performing one error syndrome measurement on the quantum circuit by using the quantum error correction code, T being an integer greater than 1; and the plurality of operations further comprise:
  after obtaining error syndrome information of a quantum circuit;
  classifying the error syndrome information into at least two data units,
  one data unit comprising T array units at a same position in the T data arrays.

16. The computer device according to claim 13, wherein the error syndrome information is real error syndrome information obtained by performing error syndrome measurement with noise on the quantum circuit by using the quantum error correction code; and the neural network decoder comprises a first decoder and a second decoder;

the first decoder is configured to decode the real error syndrome information, to obtain a logic error class corresponding to the real error syndrome information, the logic error class being a class obtained after an error occurred in the quantum circuit is mapped;

the second decoder is configured to decode the real error syndrome information, to obtain perfect error syndrome information corresponding to the real error syndrome information, the perfect error syndrome information being information obtained by performing error syndrome measurement without noise on the quantum circuit; and the plurality of operations further comprise:

after performing fusion decoding processing on the feature information by using the neural network decoder, determining, according to the logic error class and the perfect error syndrome information, the data qubit in which the error occurs in the quantum circuit and the corresponding error type.

17. A non-transitory computer-readable storage medium, storing one or more instructions, the one or more instructions being loaded and executed by a processor of a computer device to perform a plurality of operations including:

obtaining error syndrome information of a quantum circuit, the error syndrome information being a data array formed by eigenvalues of a stabilizer generator of a quantum error correction code;

performing block feature extraction on the error syndrome information by using a neural network decoder, to obtain feature information, a feature extraction layer of the neural network decoder being configured to perform the block feature extraction on inputted data, the block feature extraction being configured to, after the inputted data is partitioned into at least two blocks, perform parallel feature extraction on the at least two blocks by using at least two feature extraction units; and performing fusion decoding processing on the feature information by using the neural network decoder, to obtain error result information, the error result information being used for determining a data qubit in which an error occurs in the quantum circuit and a corresponding error type.

18. The non-transitory computer-readable storage medium according to claim 17, wherein the neural network decoder comprises m cascaded feature extraction layers, m being a positive integer; and the performing block feature extraction on the error syndrome information by using a neural network decoder, to obtain feature information comprises:

performing block feature extraction on the error syndrome information by using the m feature extraction layers, to obtain the feature information, the first feature extraction layer being configured to perform block feature extraction on the error syndrome information, the $i^{th}$ feature extraction layer being configured to perform block feature extraction on a feature extraction result of a previous feature extraction layer, i being an integer greater than 1 and less than or equal to m.

19. The non-transitory computer-readable storage medium according to claim 17, wherein the error syndrome information comprises T data arrays, and each data array is obtained by performing one error syndrome measurement on the quantum circuit by using the quantum error correction code, T being an integer greater than 1; and the plurality of operations further comprise:

after obtaining error syndrome information of a quantum circuit;

classifying the error syndrome information into at least two data units, one data unit comprising T array units at a same position in the T data arrays.

20. The non-transitory computer-readable storage medium according to claim 17, wherein the error syndrome information is real error syndrome information obtained by performing error syndrome measurement with noise on the quantum circuit by using the quantum error correction code; and the neural network decoder comprises a first decoder and a second decoder;

the first decoder is configured to decode the real error syndrome information, to obtain a logic error class corresponding to the real error syndrome information, the logic error class being a class obtained after an error occurred in the quantum circuit is mapped;

the second decoder is configured to decode the real error syndrome information, to obtain perfect error syndrome information corresponding to the real error syndrome information, the perfect error syndrome information being information obtained by performing error syndrome measurement without noise on the quantum circuit; and the plurality of operations further comprise:

after performing fusion decoding processing on the feature information by using the neural network decoder, determining, according to the logic error class and the perfect error syndrome information, the data qubit in which the error occurs in the quantum circuit and the corresponding error type.

* * * * *